US012812850B2

(12) United States Patent
Murata et al.

(10) Patent No.: US 12,812,850 B2
(45) Date of Patent: Nov. 24, 2026

(54) SEMICONDUCTOR DEVICE

(71) Applicant: Kioxia Corporation, Tokyo (JP)

(72) Inventors: Takeshi Murata, Yokkaich Mie (JP); Kazuharu Yamabe, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 554 days.

(21) Appl. No.: 18/177,010

(22) Filed: Mar. 1, 2023

(65) Prior Publication Data

US 2023/0397414 A1 Dec. 7, 2023

(30) Foreign Application Priority Data

Jun. 6, 2022 (JP) ................................ 2022-091833
Dec. 20, 2022 (JP) ................................ 2022-203481

(51) Int. Cl.

| | |
|---|---|
| ***H10W 20/42*** | (2026.01) |
| ***H10B 41/10*** | (2023.01) |
| ***H10B 41/27*** | (2023.01) |
| ***H10B 43/10*** | (2023.01) |
| ***H10B 43/27*** | (2023.01) |
| ***H10W 20/41*** | (2026.01) |

(52) U.S. Cl.
CPC ............. *H10B 41/27* (2023.02); *H10B 41/10* (2023.02); *H10B 43/10* (2023.02); *H10B 43/27* (2023.02); *H10W 20/42* (2026.01); *H10W 20/435* (2026.01)

(58) Field of Classification Search
CPC ........ H10B 41/10; H10B 43/10; H10B 43/27; H10B 43/40; H10B 43/50; H10B 41/27; H01L 23/5226; H01L 23/5283; H01L 24/08; H10W 20/42; H10W 20/435; H10W 72/90
See application file for complete search history.

(56) References Cited

U.S. PATENT DOCUMENTS 9,917,093 B2 3/2018 Chu et al.
11,088,164 B2 8/2021 Shimizu
(Continued)

FOREIGN PATENT DOCUMENTS

CN 109545786 A 3/2019
CN 110620116 A 12/2019
(Continued)

*Primary Examiner* — Galina G Yushina
(74) *Attorney, Agent, or Firm* — Foley & Lardner LLP

(57) ABSTRACT

A semiconductor device includes a stack of films including electrode layers separated in a first direction; an array region including a memory cell array, the memory cell array having word lines and select lines that constitute the electrode layers; a first plug region located in a second direction from the array region, and including a first contact plug electrically connected to a first select line of the select lines; and a second plug region located in the second direction from the first plug region, and including a second contact plug electrically connected to a first word line. The first plug region includes first insulating films disposed in the stack of films and extending in the second direction; and second insulating films disposed in the stack of films and each second insulating film having a portion extending between corresponding two of the first insulating films.

15 Claims, 18 Drawing Sheets

(56) References Cited

U.S. PATENT DOCUMENTS

| | | | | |
|---|---|---|---|---|
| 11,239,247 | B2 | 2/2022 | Sun et al. | |
| 2009/0020744 | A1 | 1/2009 | Mizukami et al. | |
| 2014/0306279 | A1* | 10/2014 | Park | H10B 41/27 257/314 |
| 2014/0346682 | A1 | 11/2014 | Lee et al. | |
| 2017/0103995 | A1* | 4/2017 | Hatano | H10B 41/30 |
| 2018/0047744 | A1* | 2/2018 | Utsumi | G11C 29/022 |
| 2019/0088672 | A1 | 3/2019 | Tomimatsu | |
| 2019/0237477 | A1* | 8/2019 | Baek | H10B 43/40 |
| 2019/0386018 | A1 | 12/2019 | Watanabe et al. | |
| 2020/0273879 | A1 | 8/2020 | Shimizu | |
| 2020/0321350 | A1* | 10/2020 | Oike | H10B 41/30 |
| 2021/0036005 | A1 | 2/2021 | Oh | |
| 2021/0036007 | A1 | 2/2021 | Oh et al. | |
| 2021/0043640 | A1 | 2/2021 | Kawaguchi et al. | |
| 2021/0118861 | A1* | 4/2021 | Yun | H10B 41/10 |
| 2021/0118862 | A1 | 4/2021 | Maejima et al. | |
| 2021/0233846 | A1* | 7/2021 | Utsumi | H01L 23/5226 |
| 2021/0265389 | A1* | 8/2021 | Kim | H10B 43/10 |
| 2021/0313246 | A1* | 10/2021 | Matsumura | H10B 43/40 |
| 2022/0093639 | A1 | 3/2022 | Song et al. | |
| 2022/0181347 | A1* | 6/2022 | Hu | H10B 41/50 |

FOREIGN PATENT DOCUMENTS

| | | | |
|---|---|---|---|
| CN | 111613620 | A | 9/2020 |
| CN | 112670298 | A | 4/2021 |
| CN | 219679156 | U | 9/2023 |
| JP | 2009-016400 | A | 1/2009 |
| JP | 2020-136644 | A | 8/2020 |
| JP | 2021-027290 | A | 2/2021 |
| JP | 2021-064731 | A | 4/2021 |
| TW | 202032770 | A | 9/2020 |
| TW | 202211238 | A | 3/2022 |

* cited by examiner

SEMICONDUCTOR DEVICE

CROSS-REFERENCE TO RELATED APPLICATION(S)

This application is based upon and claims the benefit of priority from Japanese Patent Application No. 2022-091833, filed Jun. 6, 2022 and Japanese Patent Application No. 2022-203481, filed Dec. 22, 2022, the entire contents of which are incorporated herein by reference.

FIELD

Embodiments described herein relate generally to a semiconductor device.

BACKGROUND

In a three-dimensional semiconductor memory, when a plurality of slits are formed in a stack of films forming an electrode layer and an insulating film for dividing the electrode layer is formed between the slits, a space in which the insulating film is to be disposed may be insufficient.

DETAILED DESCRIPTION

Embodiments provide a semiconductor device in which an insulating film for dividing an electrode layer can be suitably disposed.

In general, according to at least one embodiment, the semiconductor device includes a substrate, and a stack of films provided above the substrate and including a plurality of electrode layers separated from each other in a first direction. The device further includes an array region provided on the substrate and including a memory cell array having a plurality of word lines and a plurality of select lines that constitute the plurality of electrode layers. The device further includes a first plug region provided on the substrate, located in a second direction from the array region, and including a first contact plug electrically connected to a first select line of the plurality of select lines. The device further includes a second plug region provided on the substrate, located in the second direction from the first plug region, and including a second contact plug electrically connected to a first word line of the plurality of word lines.

Hereinafter, embodiments will be described with reference to the drawings. In FIGS. 1 to 18, the same elements are denoted by the same reference symbols, and repeated descriptions will be omitted.

First Embodiment

Figure 1:
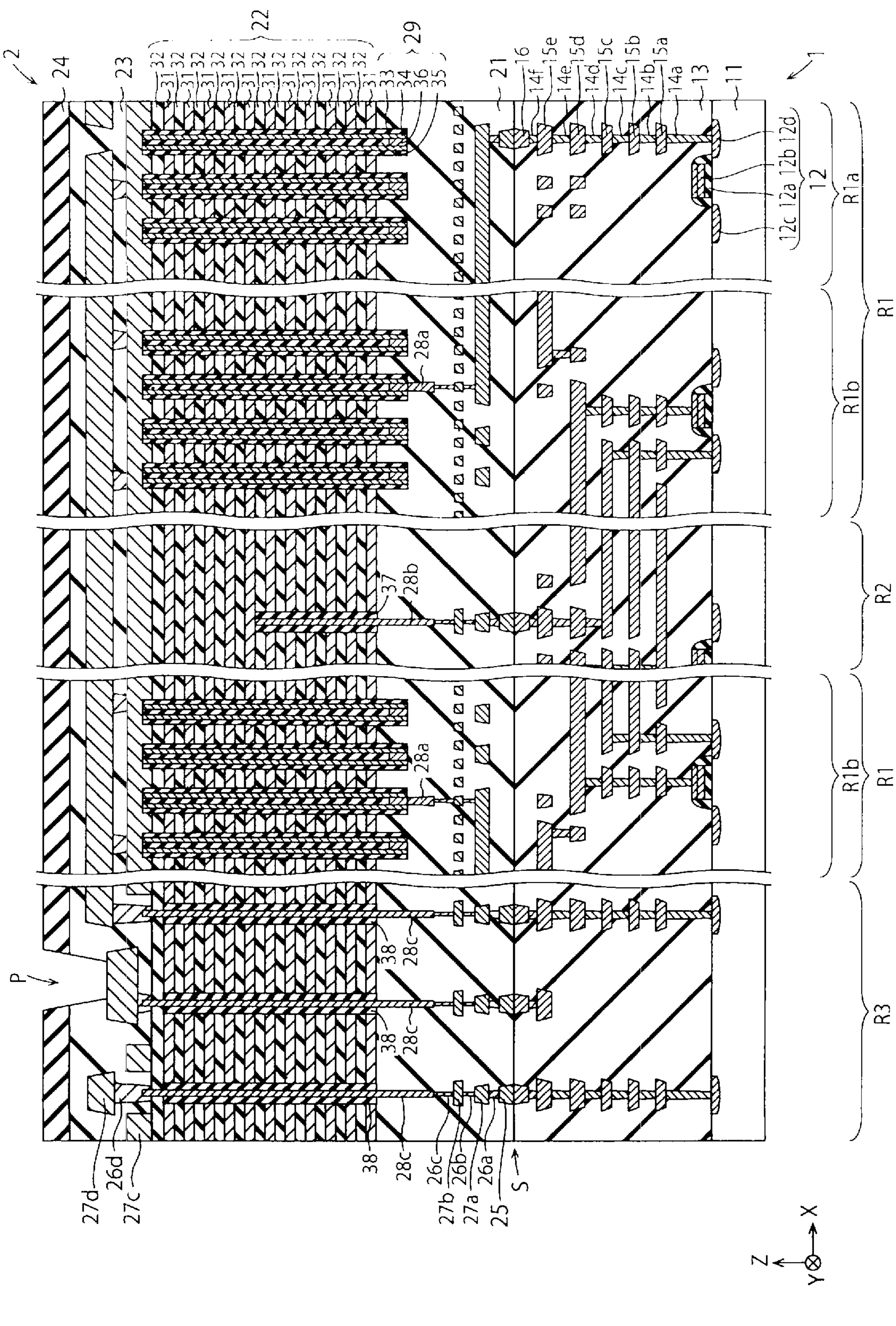
FIG. 1 is a cross-sectional view showing a structure of a semiconductor device according to a first embodiment.

FIG. 1 is a cross-sectional view showing a structure of a semiconductor device according to a first embodiment.

The semiconductor device according to at least one embodiment includes, for example, a three-dimensional semiconductor memory. As will be described later, the semiconductor device according to at least one embodiment is manufactured by bonding a circuit wafer including a circuit chip 1 and an array wafer including an array chip 2. FIG. 1 shows a bonding surface S between the circuit chip 1 and the array chip 2.

The circuit chip 1 includes a substrate 11, a plurality of transistors 12, an interlayer insulating film 13, a plurality of plugs 14*a* to 14*f*, a plurality of wiring layers 15*a* to 15*e*, and a plurality of metal pads 16. Each of the transistors 12 includes a gate insulating film 12*a*, a gate electrode 12*b*, and diffusion layers 12*c* and 12*d*.

The array chip 2 includes an interlayer insulating film 21, a stack of films 22, an interlayer insulating film 23, a passivation film 24, a plurality of metal pads 25, a plurality of plugs 26*a* to 26*d*, a plurality of wiring layers 27*a* to 27*d*, a plurality of contact plugs 28*a* to 28*c*, and a plurality of columnar portions 29. The stack of films 22 includes a plurality of electrode layers 31 and a plurality of insulating films 32. Each of the columnar portions 29 includes a memory insulating film 33, a channel semiconductor layer 34, a core insulating film 35, and a core semiconductor layer

36. The array chip 2 further includes an insulating film 37 for each contact plug 28*b* and an insulating film 38 for each contact plug 28*c*.

The substrate 11 is, for example, a semiconductor substrate such as a Si (silicon) substrate. FIG. 1 shows an X direction and a Y direction that are parallel to a surface of the substrate 11 and perpendicular to each other, and a Z direction perpendicular to the surface of the substrate 11. The X direction, the Y direction, and the Z direction intersect each other. In this description, a +Z direction is set as an upward direction, and a −Z direction is set as a downward direction. The −Z direction may coincide with the direction of gravity or may not coincide with the direction of gravity. The Z direction is an example of a first direction, the X direction is an example of a second direction, and the Y direction is an example of a third direction.

FIG. 1 further shows two array regions R1, one plug region R2, and one pad region R3 on the substrate 11. FIG. 1 further shows one partial region R1*a* and two partial regions R1*b* in the array regions R1.

Each of the array regions R1 includes a memory cell array, and specifically, includes a plurality of columnar portions 29 and a plurality of contact plugs 28*a* electrically connected to the columnar portions 29. FIG. 1 shows two of the contact plugs 28*a*. It is noted that the number of the array regions R1 in the semiconductor device according to the present embodiment may be other than two.

The plug region R2 includes a contact plug for a word line and a select line, and specifically, includes a plurality of contact plugs 28*b* electrically connected to the plurality of electrode layers 31. FIG. 1 shows one of the contact plugs 28*b*. It is noted that the number of the plug region R2 in the semiconductor device according to the present embodiment may be other than one.

The pad region R3 includes a bonding pad of the semiconductor device according to the present embodiment, and specifically, includes an opening P through which the bonding pad is exposed and a plurality of contact plugs 28*c* electrically connected to the bonding pad and other wirings. FIG. 1 shows three of the contact plugs 28*c*. It is noted that the number of the pad region R3 in the semiconductor device according to the present embodiment may be other than one.

The partial region R1*a* is an S/A (sense amplifier) region, and specifically, includes a plurality of transistors 12 for sense amplifier. Each of the transistors 12 in the partial region R1*a* is electrically connected to the contact plug 28*a*. It is noted that the number of the partial region R1*a* in the semiconductor device according to the present embodiment may be other than one.

Each of the partial regions R1*b* is a WLSW (word line switch) region, and specifically, includes a plurality of transistors 12 for word line and select line. Each of the transistors 12 in the partial region R1*b* is electrically connected to the contact plug 28*b*. It is noted that the number of the partial regions R1*b* in the semiconductor device according to the present embodiment may be other than two.

Each transistor 12 includes a gate insulating film 12*a* and a gate electrode 12*b* sequentially formed on the substrate 11, and diffusion layers 12*c* and 12*d* formed in the substrate 11. One of the diffusion layers 12*c* and 12*d* functions as a source region, and the other one of the diffusion layers 12*c* and 12*d* functions as a drain region. The circuit chip 1 includes a plurality of transistors 12 on the substrate 11, and the transistors 12 constitute, for example, a control circuit (logic circuit) that controls an operation of the memory cell array in the array chip 2.

The interlayer insulating film 13 is formed on the substrate 11 and covers the transistors 12. The interlayer insulating film 13 is, for example, a stack of films including a $SiO_2$ film (silicon oxide film) and other insulating films.

The plugs 14*a* to 14*f* and the wiring layers 15*a* to 15*e* are formed on the substrate 11 and each transistor 12 in the order of the plug 14*a*, the wiring layer 15*a*, the plug 14*b*, the wiring layer 15*b*, the plug 14*c*, the wiring layer 15*c*, the plug 14*d*, the wiring layer 15*d*, the plug 14*e*, the wiring layer 15*e*, and the plug 14*f*. The plug 14*a* corresponds to a contact plug, and the plugs 14*b* to 14*f* correspond to via plugs. Each of the wiring layers 15*a* to 15*e* includes a plurality of wirings in one wiring layer. The plugs 14*a* to 14*f* and the wiring layers 15*a* to 15*e* are provided in the interlayer insulating film 13.

The plurality of metal pads 16 described above are disposed on the plugs 14*f* in the interlayer insulating film 13. The metal pads 16 and the interlayer insulating film 13 form an upper surface of the circuit chip 1 and contact with a lower surface of the array chip 2. Each metal pad 16 includes, for example, a Cu (copper) layer.

The interlayer insulating film 21 is formed on the interlayer insulating film 13. The interlayer insulating film 21 is, for example, a stack of films including a $SiO_2$ film and other insulating films, similarly to the interlayer insulating film 13.

The stack of films 22 includes a plurality of electrode layers 31 and a plurality of insulating films 32 alternately provided on the interlayer insulating film 21. The electrode layers 31 are separated from each other in the Z direction. The electrode layers 31 include, for example, a plurality of word lines and a plurality of select lines extending in the X direction in each array region R1. Each electrode layer 31 includes, for example, a W (tungsten) layer. Each insulating film 32 is, for example, a $SiO_2$ film.

The interlayer insulating film 23 may be formed on the stack of films 22. The interlayer insulating film 23 is, for example, a stack of films including a $SiO_2$ film and other insulating films, similarly to the interlayer insulating films 13 and 21.

A passivation film 24 is formed on the interlayer insulating film 23. The passivation film 24 is, for example, a stack of films including a $SiO_2$ film, a SiN film (silicon nitride film), and other insulating films. FIG. 1 shows the opening P formed in the passivation film 24 and the interlayer insulating film 23.

The plurality of metal pads 25 described above are disposed on the metal pads 16 in the interlayer insulating film 21. The metal pads 16 and the interlayer insulating film 21 form the lower surface of the array chip 2 and contact with the upper surface of the circuit chip 1. Each metal pad 16 includes, for example, a Cu (copper) layer.

The plugs 26*a* to 26*d* and the wiring layers 27*a* to 27*d* are formed on the metal pads 25 in the interlayer insulating film 21 in the order of the plug 26*a*, the wiring layer 27*a*, the plug 26*b*, the wiring layer 27*b*, and the plug 26*c*, and on the stack of films 22 in the interlayer insulating film 23 in the order of the wiring layer 27*c*, the plug 26*d*, and the wiring layer 27*d*. The plugs 26*a* and 26*b* correspond to via plugs, and the plug 26*c* corresponds to a contact plug. Each of the wiring layers 27*a* to 27*d* includes a plurality of wirings in one wiring layer. The wiring layer 27*b* in each array region R1 includes a plurality of wirings extending in the Y direction, and the wirings correspond to bit lines. In addition, the wiring layer 27*d* in the pad region R3 includes a wiring exposed to the opening P, and this wiring corresponds to a bonding pad.

Each contact plug 28*a* is disposed on the plug 26*c* in the array region R1, and is electrically connected to any one of the columnar portions 29. Each contact plug 28*b* is disposed on the plug 26*c* in the plug region R2, and is electrically connected to any one of the electrode layers 31. A part of each contact plug 28*b* is formed in the stack of films 22 via the insulating film 37. Each contact plug 28*c* is disposed on the plug 26*c* in the pad region R3, and is electrically connected to any one of the plugs 26*d*. A part of each contact plug 28*c* is formed in the stack of films 22 via the insulating film 38.

The contact plug 28*b* shown in FIG. 1 is electrically connected to the seventh electrode layer 31 from the bottom, and penetrates the first to sixth electrode layers 31 from the bottom. Similarly, when each contact plug 28*b* of the present embodiment is electrically connected to the N-th (N is an integer of 2 or more) electrode layer 31 from the bottom, the contact plug 28*b* penetrates the first to (N−1)-th electrode layers 31 from the bottom. Further details of each contact plug 28*b* of the present embodiment will be described later. Meanwhile, each contact plug 28*a* of the present embodiment is not disposed in the stack of films 22, and each contact plug 28*c* of the present embodiment penetrates the stack of films 22.

Each columnar portion 29 is formed in the stack of films 22 and has a columnar shape extending in the Z direction. Each columnar portion 29 includes the memory insulating film 33, the channel semiconductor layer 34, and the core insulating film 35 that are provided in this order in the stack of films 22, and the core semiconductor layer 36 provided below the core insulating film 35. The channel semiconductor layer 34 is, for example, a polysilicon layer. The core insulating film 35 is, for example, a $SiO_2$ film. The core semiconductor layer 36 is, for example, a polysilicon layer. The core semiconductor layer 36 is electrically connected to the channel semiconductor layer 34. In addition, the channel semiconductor layer 34 is electrically connected to a wiring (source line) in the wiring layer 27*c*, and the core semiconductor layer 36 is electrically connected to a wiring (bit line) in the wiring layer 27*b* via the contact plug 28*a*.

Figure 2:
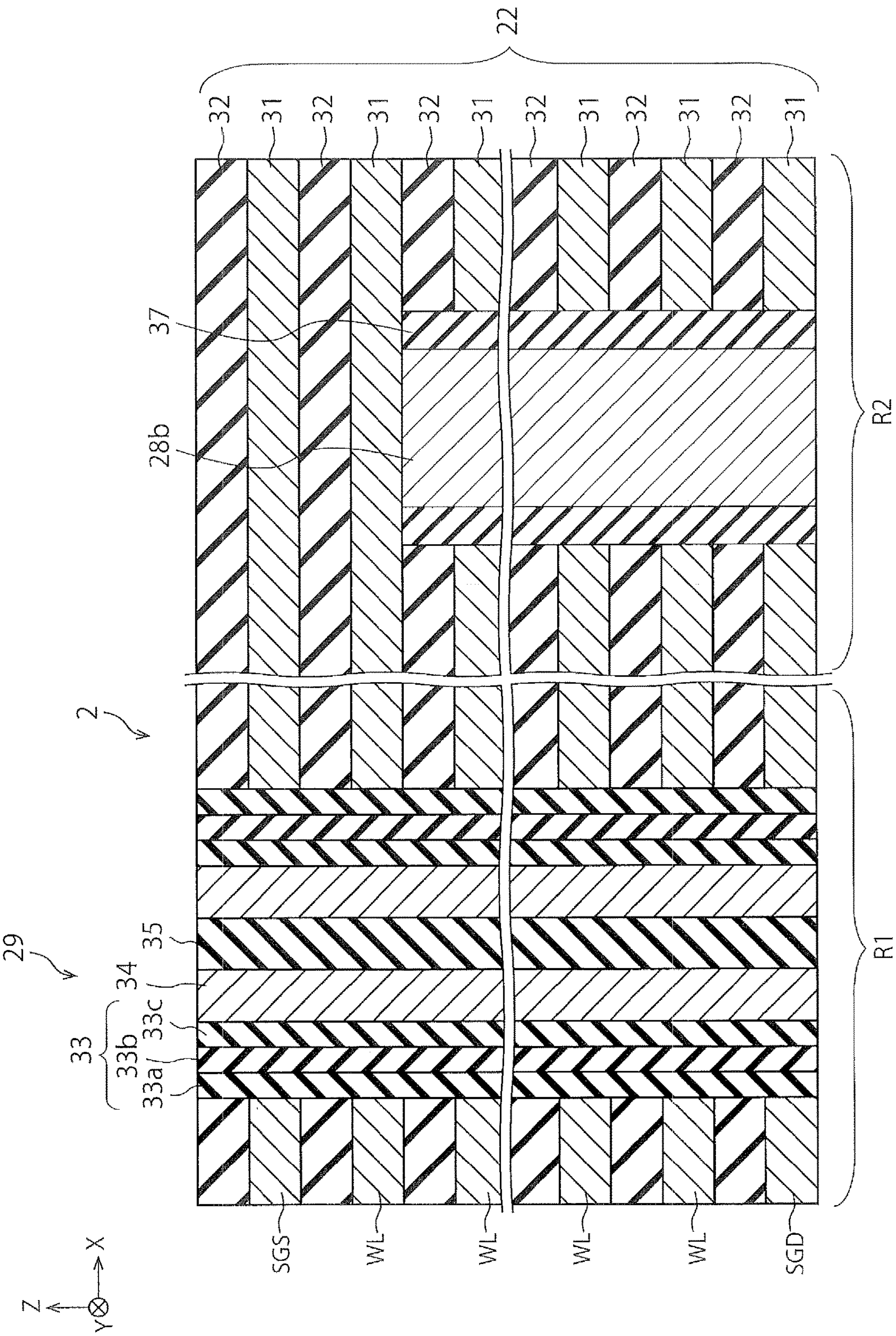
FIG. 2 is a cross-sectional view showing structures of a columnar portion and a contact plug according to the first embodiment.

FIG. 2 is a cross-sectional view showing structures of the columnar portion 29 and the contact plug 28*b* according to the first embodiment.

FIG. 2 shows one of the plurality of columnar portions 29 shown in FIG. 1. The columnar portion 29 shown in FIG. 2 includes the memory insulating film 33, the channel semiconductor layer 34, the core insulating film 35, and the core semiconductor layer 36 (not shown), and the memory insulating film 33 includes a block insulating film 33*a*, a charge storage layer 33*b*, and a tunnel insulating film 33*c* provided in this order in the stack of films 22. The block insulating film 33*a* is, for example, a $SiO_2$ film. The charge storage layer 33*b* is, for example, a SiN film. The tunnel insulating film 33*c* is, for example, a $SiO_2$ film.

Similarly to FIG. 1, FIG. 2 further shows the plurality of electrode layers 31 and the plurality of insulating films 32 that are provided in the stack of films 22. In FIG. 2, the stack of films 22 in the array region R1 includes a plurality of word lines WL, a source-side select line SGS, and a drain-side select line SGD as the electrode layers 31. The word lines WL form a plurality of memory cells together with the memory insulating film 33 and the channel semiconductor layer 34. The source-side select line SGS is disposed above the word lines WL, and the drain-side select line SGD is disposed below the word lines WL. It is noted that in FIG. 2, two or more source-side select lines SGS may be disposed above the word lines WL, or two or more drain-side select lines SGD may be disposed below the word lines WL.

FIG. 2 further shows one of the plurality of contact plugs 28*b* shown in FIG. 1. The contact plug 28*b* shown in FIG. 2 is provided in the stack of films 22 via the insulating film 37 and electrically connected to the corresponding word line WL.

When a certain electrode layer 31 includes a word line WL, the electrode layer 31 includes the word line WL in the array region R1 and includes a pad portion for the word line WL in the plug region R2. The pad portion is electrically connected to the word line and is electrically connected to the contact plug 28*b*. As a result, the word line WL is electrically connected to the contact plug 28*b* via the pad portion. It is noted that the term “word line WL” may be used to include the word line WL and the pad portion by regarding the pad portion as a part of the word line WL. The same applies to a pad portion for the source-side select line SGS and a pad portion for the drain-side select line SGD.

Figure 3:
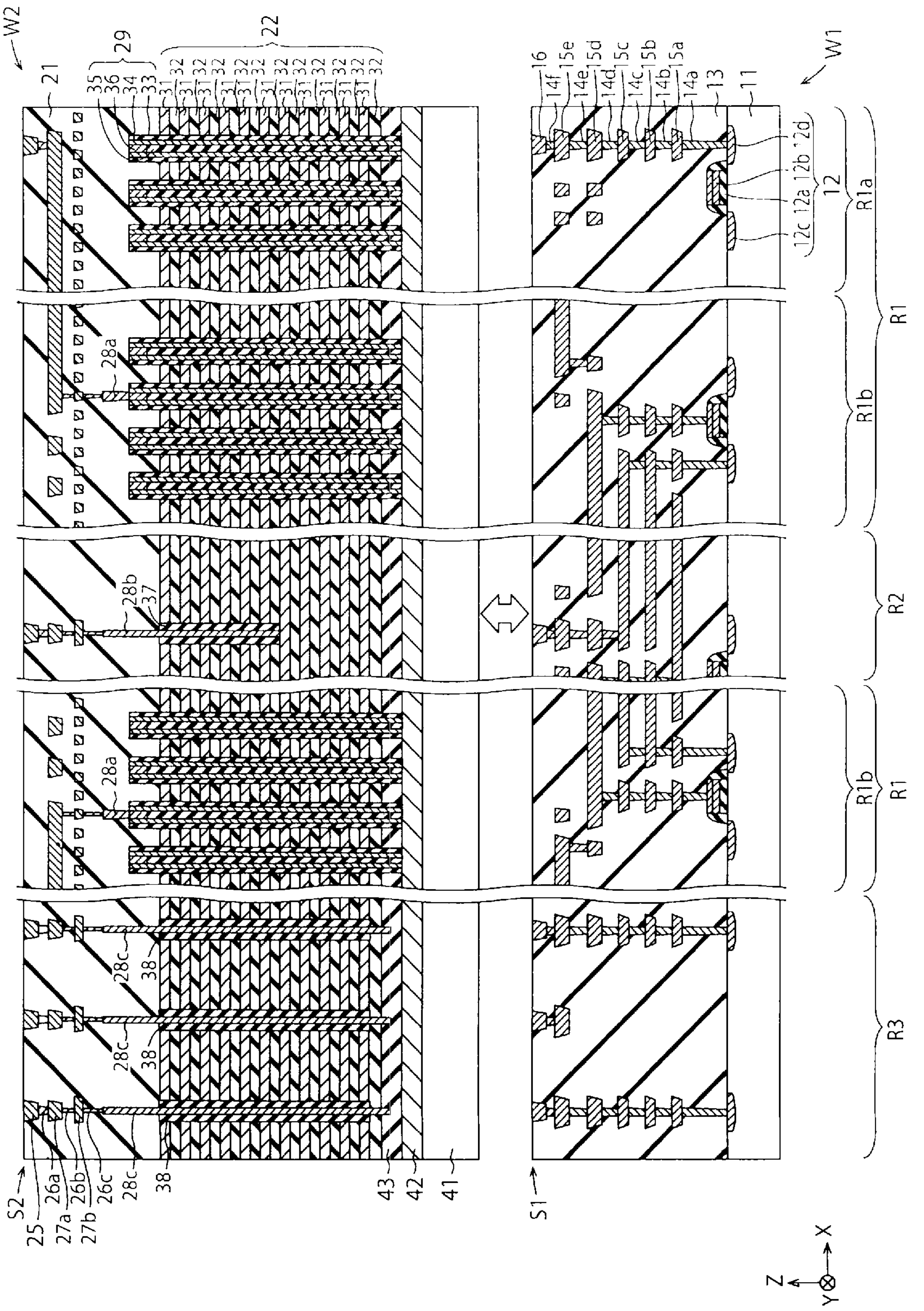
FIG. 3 is a cross-sectional view (1/2) showing a method of manufacturing the semiconductor device according to the first embodiment.
Figure 4:
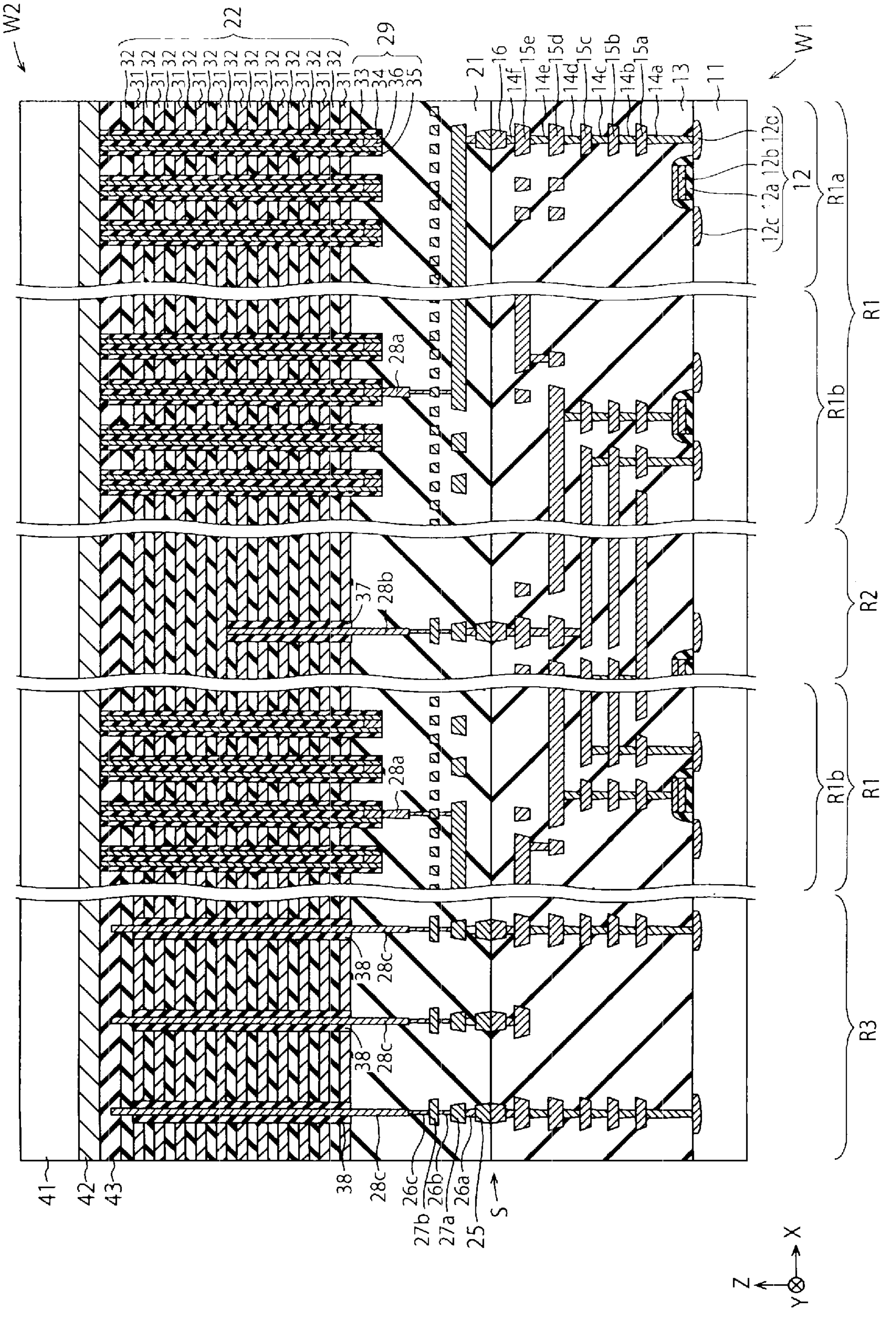
FIG. 4 is a cross-sectional view (2/2) showing the method of manufacturing the semiconductor device according to the first embodiment.

FIGS. 3 and 4 are cross-sectional views showing a method of manufacturing the semiconductor device according to the first embodiment.

FIG. 3 shows a circuit wafer W1 including the circuit chip 1 and an array wafer W2 including the array chip 2. An orientation of the array chip 2 (array wafer W2) shown in FIG. 3 is opposite to an orientation of the array chip 2 shown in FIG. 1. As described above, the semiconductor device according to the present embodiment is manufactured by bonding the circuit wafer W1 and the array wafer W2 together. FIG. 3 shows the array wafer W2 before being reversed for bonding, and FIG. 4 shows the array wafer W2 after being reversed for bonding and bonded to the circuit wafer W1.

FIG. 3 further shows an upper surface S1 of the circuit wafer W1 and an upper surface S2 of the array wafer W2. The array wafer W2 shown in FIG. 3 includes a substrate 41, a sacrificial layer 42 formed on the substrate 41, and a sacrificial layer 43 formed on the sacrificial layer 42. The stack of films 22 is formed on the sacrificial layer 43, and a part of each columnar portion 29 and each contact plug 28*c* is formed in the sacrificial layer 43. The substrate 41 is, for example, a semiconductor substrate such as a Si substrate. The sacrificial layer 42 is, for example, a polysilicon layer. The sacrificial layer 43 is, for example, a SiN film.

The semiconductor device according to the present embodiment is manufactured, for example, as follows. First, the plurality of transistors 12, the interlayer insulating film 13, the plurality of plugs 14*a* to 14*f*, the plurality of wiring layers 15*a* to 15*e*, and the plurality of metal pads 16 are formed on the substrate 11 (FIG. 3). In addition, the sacrificial layer 42, the sacrificial layer 43, the interlayer insulating film 21, the stack of films 22, the plurality of metal pads 25, the plurality of plugs 26*a* to 26*c*, the plurality of wiring layers 27*a* and 27*b*, the plurality of contact plugs 28*a* to 28*c*, and the plurality of columnar portions 29 are formed on the substrate 41 (FIG. 3).

Next, as shown in FIG. 4, the circuit wafer W1 and the array wafer W2 are bonded to each other by a mechanical pressure. Accordingly, the interlayer insulating film 13 and the interlayer insulating film 21 are adhered to each other. Next, the circuit wafer W1 and the array wafer W2 are annealed. Accordingly, the metal pads 16 and the metal pads 25 are bonded to each other.

Thereafter, the substrate 11 is thinned by chemical mechanical polishing (CMP), and the substrate 41 is removed by CMP. Further, the sacrificial layers 42 and 43 are removed to expose the stack of films 22, and the interlayer insulating film 23, the passivation film 24, the plurality of plugs 26*d*, and the plurality of wiring layers 27*c* and 27*d* are formed on the stack of films 22 (see FIG. 1). Then, the circuit wafer W1 and the array wafer W2 are cut into a plurality of chips. Accordingly, the semiconductor device shown in FIG. 1 is manufactured.

It is noted that FIG. 1 shows a boundary surface between the interlayer insulating film 13 and the interlayer insulating film 21 and a boundary surface between the metal pad 16 and the metal pad 25, but it is common that the boundary surfaces are not observed after the annealing described above. However, positions of the boundary surfaces can be estimated by detecting an inclination of a side surface of the metal pad 16, an inclination of a side surface of the metal pad 25, or positional deviation between the metal pad 16 and the metal pad 25.

Figure 5:
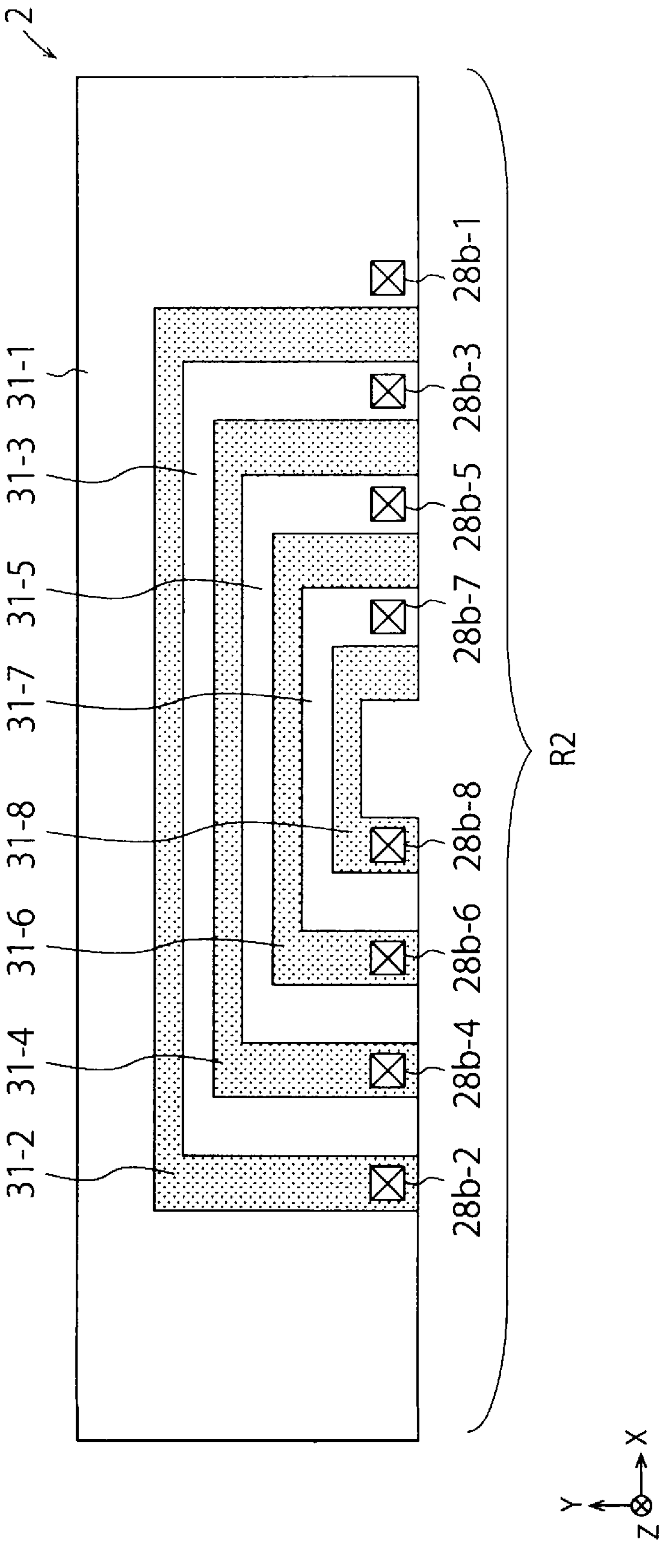
FIG. 5 is a plan view showing a layout of electrode layers and contact plugs according to the first embodiment.

FIG. 5 is a plan view showing a layout of the electrode layers 31 and the contact plugs 28*b* according to the first embodiment.

FIG. 5 shows a state in which the array chip 2 shown in FIG. 1 is viewed from bottom to top. FIG. 5 shows electrode layers 31-1 to 31-8 in the plurality of electrode layers 31 described above and contact plugs 28*b*-1 to 28*b*-8 in the plurality of contact plugs 28*b* described above. The electrode layers 31-1 to 31-8 are stacked above the substrate 11 in the order of the electrode layers 31-1 to 31-8. The contact plugs 28*b*-1 to 28*b*-8 are electrically connected to the electrode layers 31-1 to 31-8, respectively. The contact plug 28*b* shown in FIG. 1 is one of the contact plugs 28*b*-1 to 28*b*-8.

The electrode layers 31 and the contact plugs 28*b* according to the present embodiment may be arranged in the layout shown in FIG. 5, for example. In FIG. 5, a part of a lower surface of the electrode layer 31-8 is exposed from the electrode layer 31-7, and a part of a lower surface of the electrode layer 31-7 is exposed from the electrode layer 31-6. Further, a part of a lower surface of the electrode layer 31-6 is exposed from the electrode layer 31-5, and a part of a lower surface of the electrode layer 31-5 is exposed from the electrode layer 31-4. Further, a part of a lower surface of the electrode layer 31-4 is exposed from the electrode layer 31-3, a part of a lower surface of the electrode layer 31-3 is exposed from the electrode layer 31-2, and a part of a lower surface of the electrode layer 31-2 is exposed from the electrode layer 31-1.

The contact plugs 28*b*-8 to 28*b*-2 are disposed below the exposed portions of the electrode layers 31-8 to 31-2, respectively. Similarly, the contact plug 28*b*-1 is disposed below the electrode layer 31-1. In FIG. 5, the contact plugs 28*b*-1 to 28*b*-8 are arranged on a straight line in a plan view.

Figure 6:
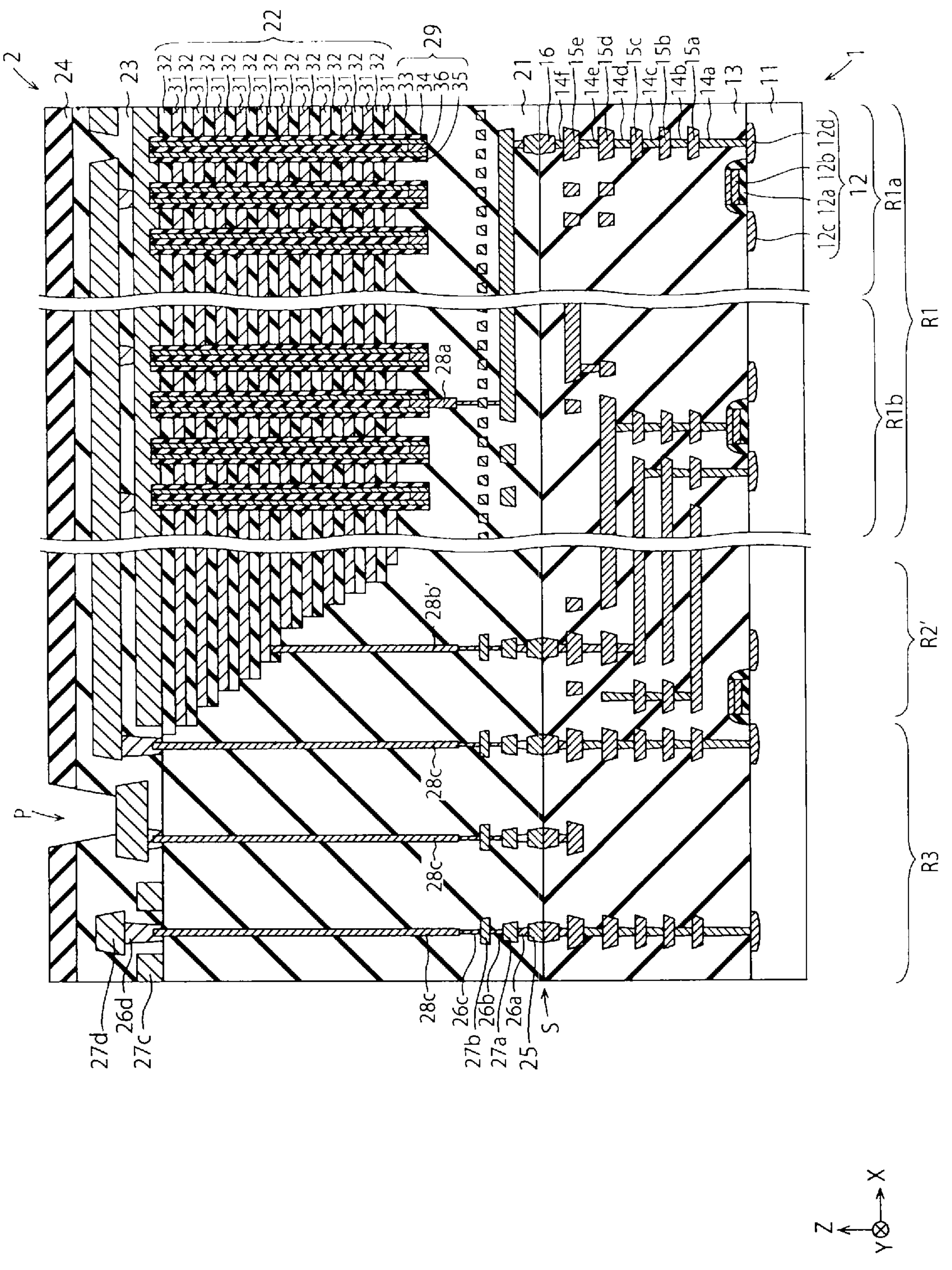
FIG. 6 is a cross-sectional view showing a structure of a semiconductor device according to a comparative example of the first embodiment.

FIG. 6 is a cross-sectional view showing a structure of a semiconductor device according to a comparative example of the first embodiment.

The semiconductor device (FIG. 6) according to the present comparative example has substantially the same structure as that of the semiconductor device (FIG. 1) according to the first embodiment. The semiconductor device according to the comparative example includes a plug region R2' instead of the plug region R2, and includes a plurality of contact plugs 28*b*' instead of the plurality of contact plugs 28*b*. FIG. 6 shows one of the contact plugs 28*b*'.

The stack of films 22 according to the comparative example has a staircase structure in the plug region R2', and the interlayer insulating film 21 is provided below the staircase structure of the stack of films 22. As a result, the contact plug 28*b*' shown in FIG. 6 is in contact with one electrode layer 31, which is similarly to the contact plug 28*b* shown in FIG. 1, but does not penetrate other electrode layers 31, which is different from the contact plug 28*b* shown in FIG. 1.

Here, the present embodiment is compared with the present comparative example. According to the present embodiment, it is not necessary to form the staircase structure as in the present comparative example, and thus the plug region R2 can be formed more easily than the plug region R2'. Meanwhile, each contact plug 28*b* of the present embodiment is formed in the stack of films 22 via the insulating film 37. Therefore, in the plug region R2 of the present embodiment, when a plurality of slits (ST to be described later) are formed in the stack of films 22 and an insulating film (52 to be described later) for dividing the electrode layers 31 is formed between the slits, a space for disposing the insulating film may be insufficient. This is because not only the stack of films 22 but also the insulating film 37 are disposed in the plug region R2. However, according to the present embodiment, by adopting the plug region R2 having a structure as described later, it is possible to address such a problem that the space is insufficient.

Figure 7A:
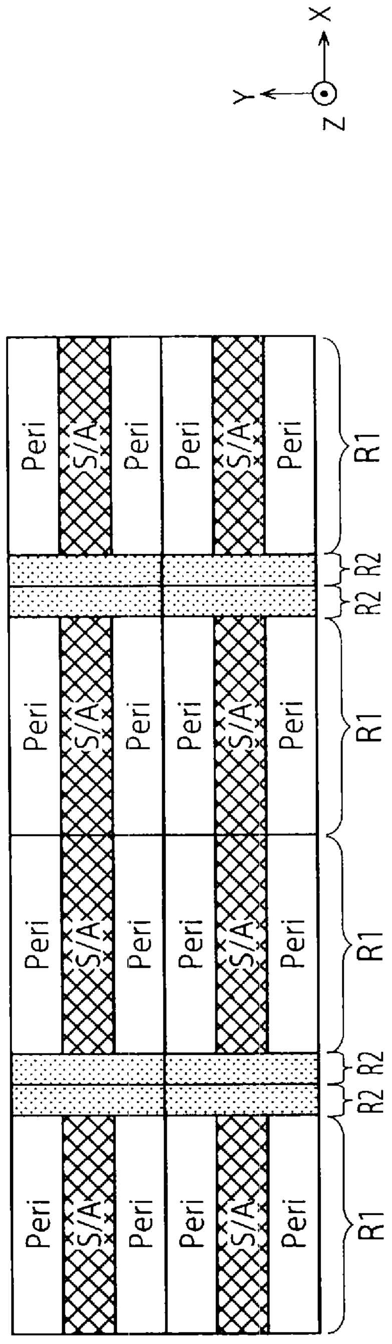
FIGS. 7A and 7B are plan views schematically showing the structure of the semiconductor device according to the first embodiment.
Figure 7B:
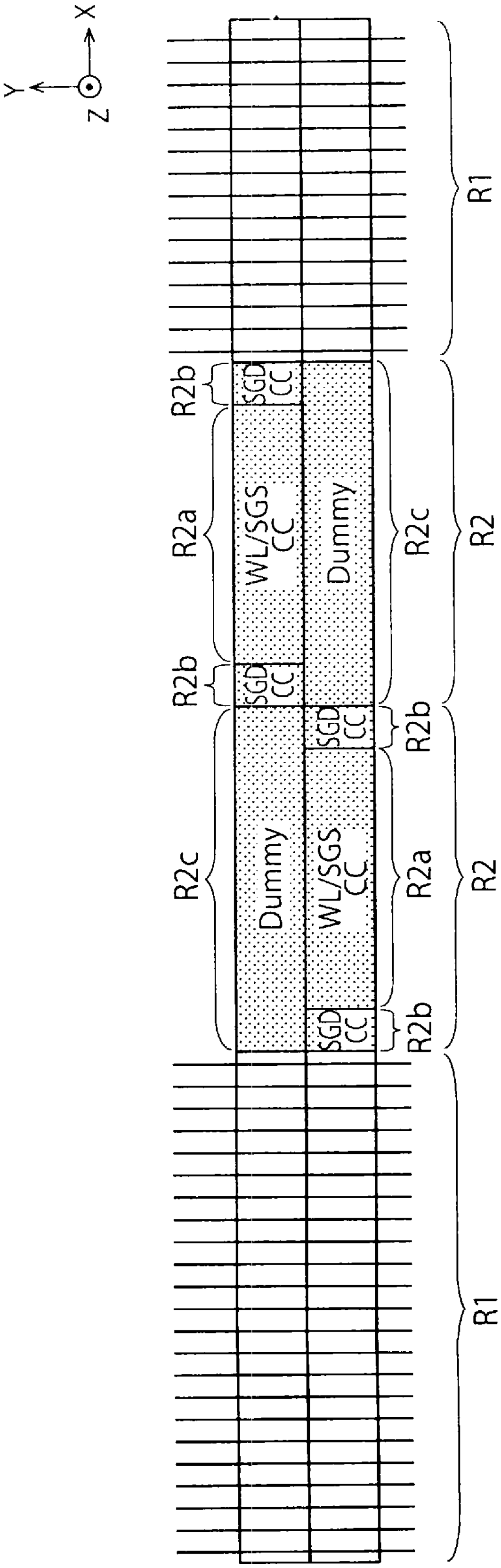

FIGS. 7A and 7B are plan views schematically showing the structure of the semiconductor device according to the first embodiment.

FIG. 7A shows eight array regions R1 and eight plug regions R2 in the semiconductor device according to the present embodiment. The array regions R1 and the plug regions R2 shown in FIGS. 7A and 7B have the same structures as those of the array regions R1 and the plug region R2 shown in FIG. 1, respectively.

FIG. 7A shows four areas including an upper left area, a lower left area, an upper right area, and a lower right area. Each area includes two array regions R1 and two plug regions R2. In each area, the plug region R2 on a left side and the plug region R2 on a right side are adjacent to each other in the X direction, and the plug regions R2 are sandwiched between the array region R1 on the left side and the array region R1 on the right side. The array regions R1 and the plug regions R2 are adjacent to each other in the X direction. Each of the array regions R1 includes one sense amplifier region denoted by a sign "S/A" and two peripheral circuit regions denoted by a sign "Peri".

FIG. 7B shows one area in FIG. 7A. In FIG. 7B, each plug region R2 includes one partial region R2*a*, two partial regions R2*b*, and one partial region R2*c*. In each plug region R2, one partial region R2*b* is an example of a first plug region, the partial region R2*a* is an example of a second plug region, and the other partial region R2*c* is an example of a third plug region. In addition, in the area shown in FIG. 7B, one array region R1 is an example of a first array region, the other array region R1 is an example of a second array region, one plug region R2 is an example of a first region, and the other plug region R2 is an example of a second region.

The partial region R2*a* is a region including the contact plug 28*b* for word line WL and source-side selection line SGS (FIGS. 1 and 2), and is referred to as a WL/SGS CC region. Each contact plug 28*b* in the partial region R2*a* is electrically connected to the word line WL or the source-side select line SGS. The word line WL is an example of a first word line. For example, in the area shown in FIG. 7B, each contact plug 28*b* provided in the partial region R2*a* in the plug region R2 on the left side is electrically connected to the word line WL or the source-side select line SGS in the array regions R1 on the left and right sides, and each contact plug 28*b* provided in the partial region R2*a* in the plug region R2 on the right side is electrically connected to the word line WL or the source-side select line SGS in the array regions R1 on the right and left sides. The word lines WL are examples of a first word line and a second word line.

Each partial region R2*b* is a region including the contact plug 28*b* for the drain-side selection line SGD (FIGS. 1 and 2), and is referred to as an SGD CC region. Each contact plug 28*b* in each partial region R2*b* is electrically connected to the drain-side select line SGD. The drain-side select line SGD is an example of a first or second select line. For example, in the plug region R2 on the left side shown in FIG. 7B, each contact plug 28*b* provided in the partial region R2*b* on the left side is electrically connected to the drain-side select line SGD in the array region R1 on the left side, and each contact plug 28*b* provided in the partial region R2*b* on the right side is electrically connected to the drain-side select line SGS in the array region R1 on the right side. The drain-side select lines SGD are examples of the first and second select lines. In the plug region R2 on the right side shown in FIG. 7B, each contact plug 28*b* provided in the partial region R2*b* on the right side is electrically connected to the drain-side select line SGD in the array region R1 on the right side, and each contact plug 28*b* provided in the partial region R2*b* on the left side is electrically connected to the drain-side select line SGS in the array region R1 on the left side. The drain-side select lines SGD are also examples of the first and second select lines.

The partial regions R2*c* are referred to as dummy regions, and may or may not include the contact plug 28*b* (FIG. 1). In each plug region R2, one partial region R2*b* is located in the +X direction from the partial region 2*a*, the other partial region R2*b* is located in the –X direction from the partial region 2*a*, and the partial region R2*c* is located in the +Y direction or the –Y direction from the partial regions R2*a* and R2*b*. In the area shown in FIG. 7B, the partial region R2*c* in the plug region R2 on the left side is located in the +Y direction from the partial regions R2*a* and R2*b* in the plug region R2 on the left side, and the partial region R2*c* in the plug region R2 on the right side is located in the –Y direction from the partial regions R2*a* and R2*b* in the plug region R2 on the right side.

Figure 8:
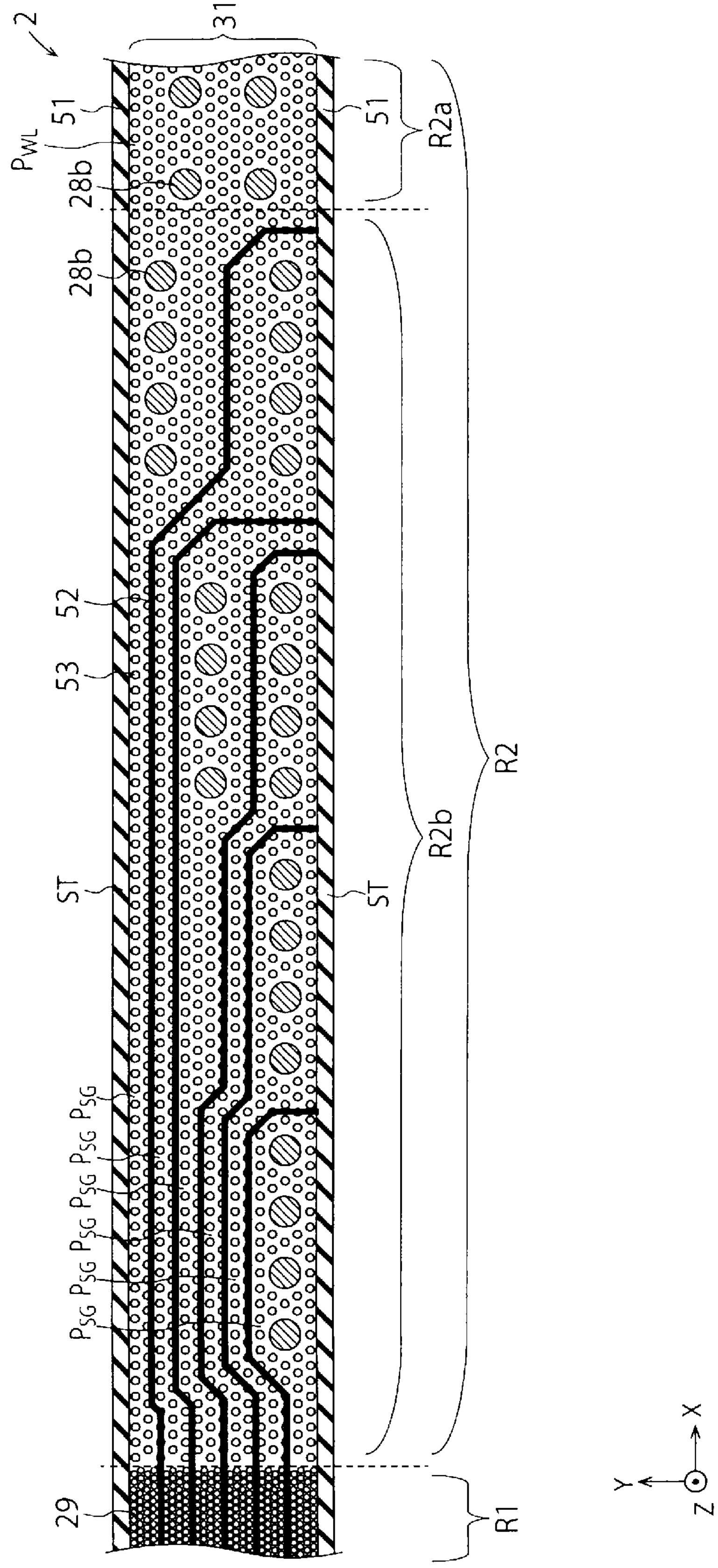
FIG. 8 is another plan view showing the structure of the semiconductor device according to the first embodiment.

FIG. 8 is another plan view showing the structure of the semiconductor device according to the first embodiment.

FIG. 8 shows the array region R1 and the partial regions R2*a* and R2*b* in the plug region R2 in FIGS. 7A and 7B. The regions are arranged in the same area, and are adjacent to each other in the X direction in the order of the array region R1, the partial region R2*b*, and the partial region R2*a*.

FIG. 8 further shows a plurality of columnar portions 29 provided in the array region R1 and a plurality of contact plugs 28*b* provided in the plug region R2. FIG. 8 further shows one electrode layer 31 in the stack of films 22. Each contact plug 28*b* shown in FIG. 8 penetrates the electrode layer 31, and is in contact with a lower surface of the electrode layer 31 or is not in contact with the lower surface of the electrode layer 31. The contact plug 28*b* in contact with the lower surface of the electrode layer 31 is electrically connected to the electrode layer 31. Meanwhile, the contact plug 28*b* that penetrates the electrode layer 31 or is not in contact with the lower surface of the electrode layer 31 is not electrically connected to the electrode layer 31 but is electrically connected to another electrode layer 31 in the stack of films 22. Each contact plug 28*b* is electrically connected to any one of the electrode layers 31 in the stack of films 22.

As shown in FIG. 8, the semiconductor device according to the present embodiment includes a plurality of slits ST, a plurality of insulating films 51, a plurality of insulating films 52, and a plurality of beam portions 53 in the stack of films 22. The insulating films 51 and 52 are provided in the array region R1 and the plug region R2, and the beam portions 53 are provided in the plug region R2. The insulating films 51 are an example of the first insulating film. The insulating films 52 are an example of the second insulating film.

The plurality of slits ST described above extend in the X direction and the Z direction in the stack of films 22 and penetrate the stack of films 22. The slits ST are used when the plurality of sacrificial layers in the stack of films 22 are replaced with the plurality of electrode layers 31 (replacement process). The sacrificial layers are, for example, SiN films. In the replacement process, the stack of films 22 including the plurality of sacrificial layers and the plurality of insulating films 32 alternately is formed, the slits ST are formed in the stack of films 22, the sacrificial layers are removed from the slits ST, and the plurality of electrode layers 31 are formed in a plurality of cavities formed by removing the sacrificial layers. As a result, the stack of films 22 including the plurality of electrode layers 31 and the plurality of insulating films 32 alternately is formed. FIG. 8 shows two of the slits ST.

The plurality of insulating films 51 described above are embedded in the plurality of slits ST described above. Therefore, the insulating films 51 extend in the X direction and the Z direction in the stack of films 22 and penetrate the stack of films 22. The insulating films 51 are, for example, $SiO_2$ films. FIG. 8 shows two of the insulating films 51. Each slit ST shown in FIG. 8 includes only the insulating film 51, but may include the insulating film 51 and other films (for example, wiring layers) as described later.

Similarly to the insulating films 51, the plurality of insulating films 52 described above extend in the X direction and the Z direction in the stack of films 22. Each insulating film 51 extends in the plan view, whereas each insulating film 52 extends in a curved shape in the plan view in the plug region R2. As shown in FIG. 8, each insulating film 52 extends between the insulating films 51. FIG. 8 shows two insulating films 51 and five insulating films 52 extending between the insulating films 51. The insulating films 52 are, for example, $SiO_2$ films. In FIG. 8, the insulating films 52 extend without coming into contact with each other, but each insulating film 52 is in contact with one of the two insulating films 51 and ends at the insulating film 51.

In the present embodiment, the insulating films 52 are disposed in the electrode layers 31 each including the drain-side selection line SGD. In FIG. 8, the electrode layer 31 in the partial region R2*b* is divided into a plurality of portions $P_{SG}$ by the insulating films 52. Each portion $P_{SG}$ functions as a pad portion that electrically connects the drain-side select line SGD to the contact plug 28*b* by being electrically connected to the contact plug 28*b*. In FIG. 8, the electrode layer 31 in the partial region R2*b* is divided into six portions $P_{SG}$ by five insulating films 52. One of the portions $P_{SG}$ is connected to a portion $P_{WL}$.

In FIG. 8, the electrode layer 31 in the partial region R2*a* includes the portion $P_{WL}$. Each contact plug 28*b* penetrating the portion $P_{WL}$ extends in the Z direction to the electrode layer 31 including the word line WL or the source-side select line SGS, and is electrically connected to the word line WL or the source-side select line SGS. In this case, a portion of the electrode layer 31 in the partial region R2*a* functions as a pad portion that electrically connects the word line WL or the source-side select line SGS to the contact plug 28*b*.

The plurality of beam portions 53 described above are provided in the stack of films 22 in the plug region R2, and extend in the Z direction in the stack of films 22. The beam portions 53 are disposed in order to limit deformation of the stack of films 22. The beam portions 53 are, for example, $SiO_2$ films.

As described above, the plurality of insulating films 52 described above extend between the insulating films 51, and end in the partial region R2*b* by coming into contact with any one of the insulating films 51. Accordingly, the electrode layer 31 in the partial region R2*b* can be divided into a plurality of portions $P_{SG}$ each having a suitable shape. Specifically, the shape of the portions $P_{SG}$ can be set to a shape in which the contact plugs 28*b* are easily disposed in each portion $P_{SG}$.

For example, when each insulating film 52 extends in the X direction in the partial region R2*b*, the shape of each portion $P_{SG}$ is an elongated shape extending in the X direction, and it is difficult to dispose the contact plugs 28*b* in each portion $P_{SG}$. Therefore, it is necessary to increase a distance between the insulating films 51 and to reduce the number of the insulating films 52 between the insulating films 51. On the other hand, according to the present embodiment, it is possible to make the shape of each portion $P_{SG}$ approximate to a shape that is not elongated, and it is easy to dispose the contact plugs 28*b* in each portion $P_{SG}$. In other words, according to the present embodiment, even if a large number of contact plugs 28*b* are disposed in the partial region R2*b*, it is possible to secure a space sufficient for disposing the insulating films 52 in the partial region R2*b*. In FIG. 8, the plurality of contact plugs 28*b* can be disposed in each portion $P_{SG}$ (multiple arrangement), and specifically, four contact plugs 28*b* are disposed in each portion $P_{SG}$.

Next, semiconductor devices according to first to third modifications of the present embodiment will be described.

(1) First Modification

Figure 9A:
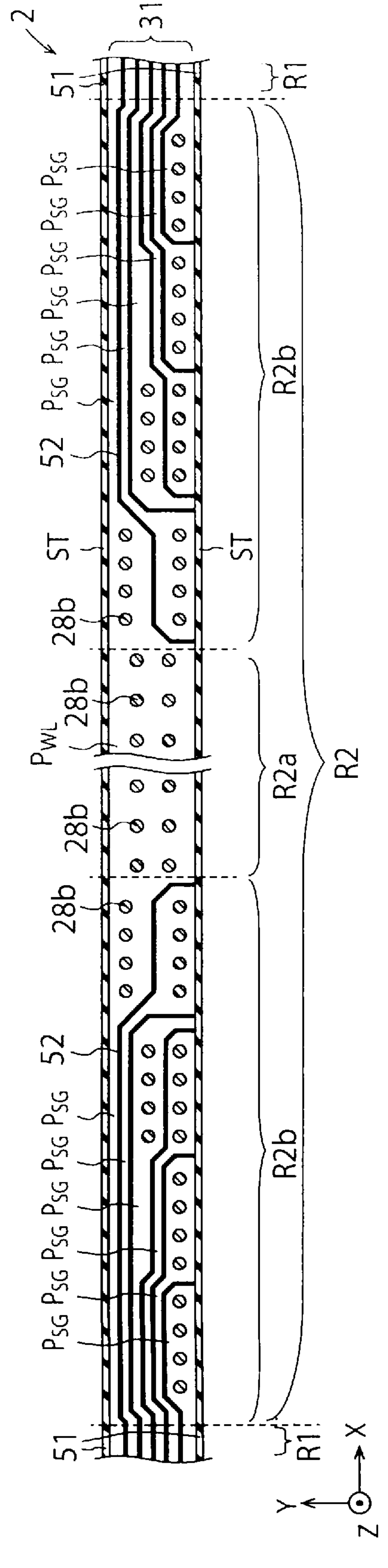
FIG. 9A is a plan view showing the structure of the semiconductor device according to the first embodiment.
Figure 9B:
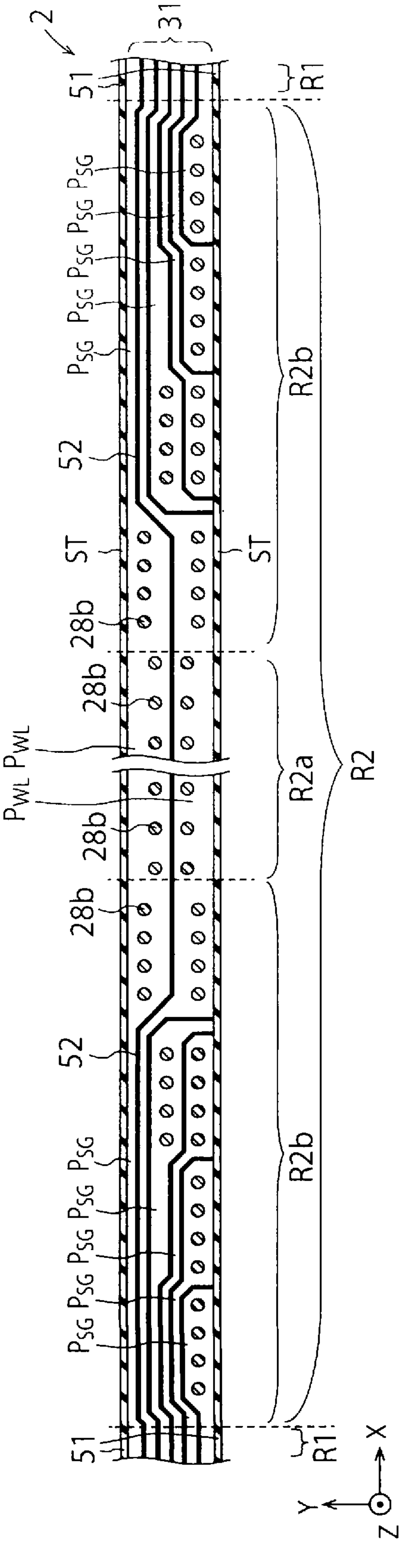
FIG. 9B is a plan view showing a structure of a semiconductor device according to a first modification of the first embodiment.

FIG. 9A is a plan view showing the structure of the semiconductor device according to the first embodiment, and FIG. 9B is a plan view showing a structure of the semiconductor device according to the first modification of the first embodiment.

FIG. 9A shows the semiconductor device according to the present embodiment. FIG. 9A shows two array regions R1 and one plug region R2 between the array regions R1. The plug region R2 includes one partial region R2*a* and two partial regions R2*b*. It is noted that in FIG. 9A, the partial region R2*c* is omitted. The same applies to FIG. 9B and FIG. 10 described later.

Structures of the array regions R1 and the plug region R2 shown in FIG. 9A are the same as the structures of the array regions R1 and the plug regions R2 shown in FIGS. 7A, 7B, and 8. In FIG. 9A, the beam portions 53 are omitted in order to make the drawing easy to see. The same applies to FIG. 9B and FIG. 10 described later.

FIG. 9B shows the semiconductor device according to the first modification of the present embodiment.

Similarly to FIG. 9A, FIG. 9B shows the plurality of insulating films 52 extending between two insulating films 51. The plurality of insulating films 52 shown in FIG. 9A all end at one insulating film 51 in the partial regions R2*b*, whereas one of the plurality of insulating films 52 shown in FIG. 9B does not end at any one of the insulating films 51 and is not in contact with any one of the insulating films 51. As a result, the electrode layer 31 in the partial region R2*a* shown in FIG. 9B is divided into two portions $P_{WL}$ by the insulating film 52.

Thus, the plurality of insulating films 52 extending between the insulating films 51 may include the insulating film 52 that is not in contact with any one of the insulating films 51.

(2) Second Modification

Figure 10:
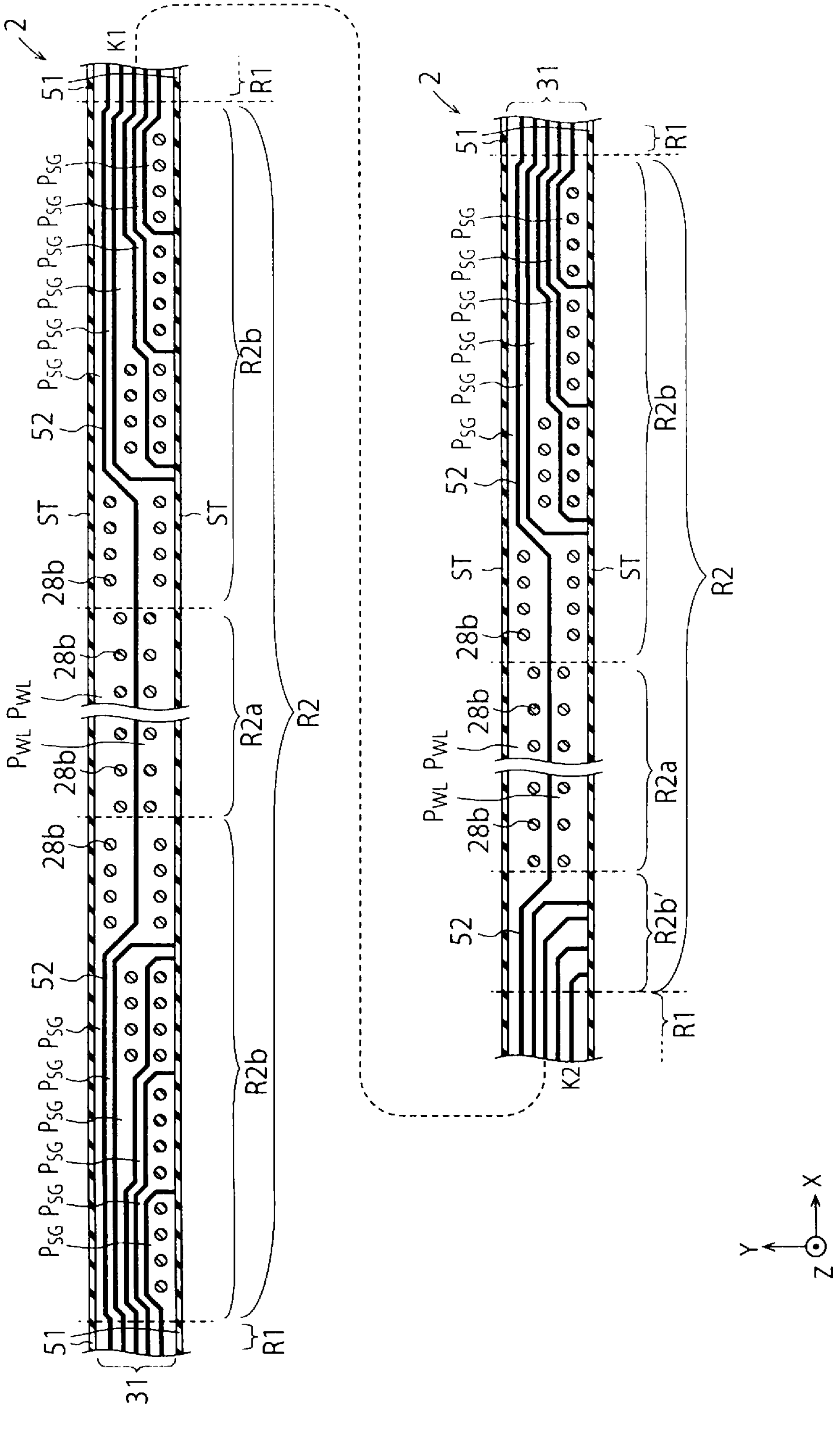
FIG. 10 is a plan view showing a structure of a semiconductor device according to a second modification of the first embodiment.

FIG. 10 is a plan view showing a structure of the semiconductor device according to the second modification of the first embodiment.

The semiconductor device according to this modification has a structure in which one plug region R2 shown in FIG. 9B is divided into two plug regions R2. As a result, the semiconductor device according to the present modification includes the two array regions R1 shown in FIG. 9B and another array region R1 provided between the two plug regions R2. In the present modification, the plurality of contact plugs 28*b* in one plug region R2 shown in FIG. 9B are dispersedly disposed in two plug regions R2 shown in FIG. 10. Regarding the arrangement of the contact plugs 28*b*, the arrangement shown in FIG. 9B is referred to as concentrated arrangement, and the arrangement shown in FIG. 10 is referred to as dispersed arrangement.

FIG. 10 shows one electrode layer 31 divided into a portion on a point K1 side and a portion on a point K2 side. A point K1 and a point K2 are located in the same array region R1. In the pad region R2 on the point K2 side according to the present modification, one partial region R2*b* is replaced with a partial region R2*b*' that is a mere boundary region. The contact plugs 28*b* according to the present modification are not disposed in the partial region R2*b*'.

(3) Third Modification

Figure 11:
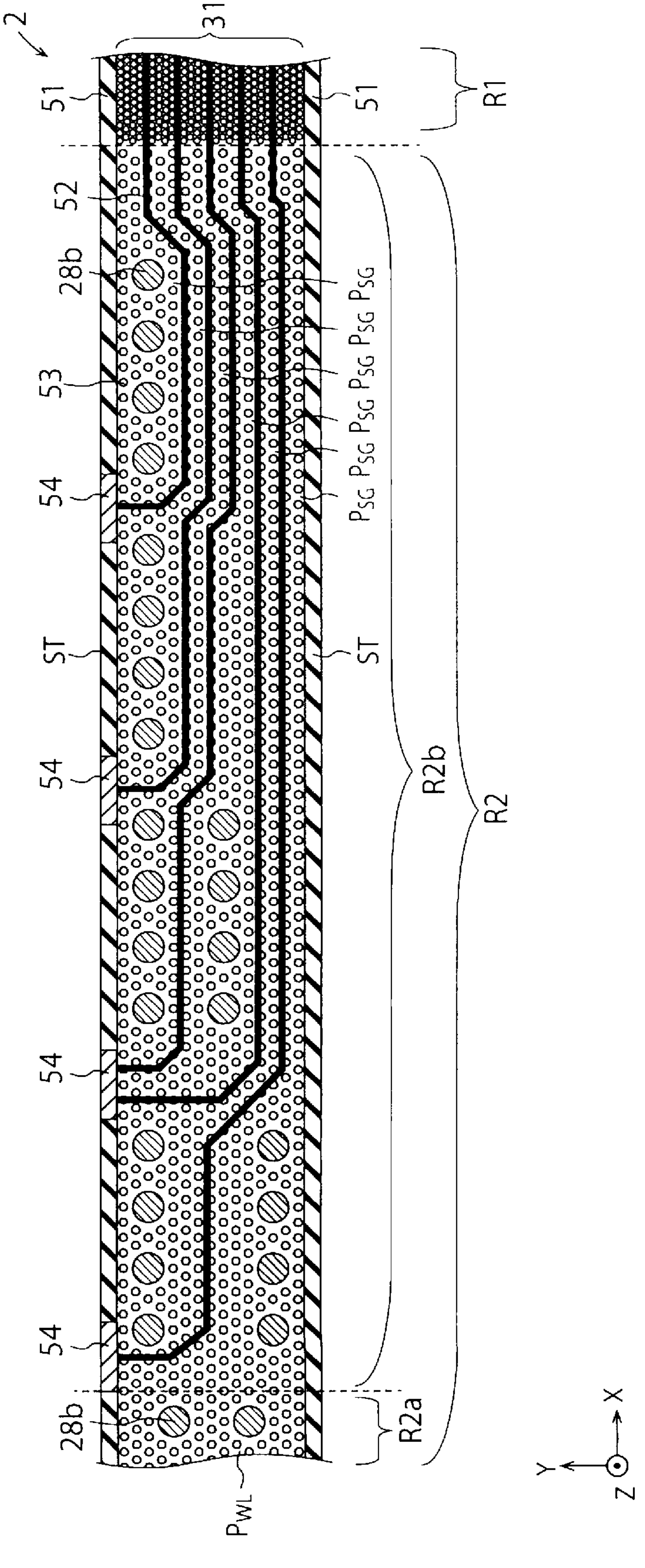
FIG. 11 is a plan view showing a structure of a semiconductor device according to a third modification of the first embodiment.

FIG. 11 is a plan view showing a structure of the semiconductor device according to the third modification of the first embodiment.

Similarly to FIG. 8, FIG. 11 shows the array region R1 and the partial regions R2*a* and R2*b* in the plug region R2. FIG. 8 shows the plug region R2 on the right side of the array region R1, whereas FIG. 11 shows the plug region R2 on the left side of the array region R1.

Similarly to FIG. 8, FIG. 11 shows the plurality of insulating films 52 extending between two insulating films 51. The semiconductor device according to the present modification includes, in addition to the elements shown in FIG. 8, a plurality of bridge portions 54 provided at positions overlapping one insulating film 51 in plan view. In FIG. 11, the bridge portions 54 are disposed in the partial region R2*b*. Each insulating film 52 according to the present modification ends at any one of the bridge portions 54 and is in contact with the bridge portion 54. Each bridge portion 54 is, for example, a metal layer.

Figure 12:
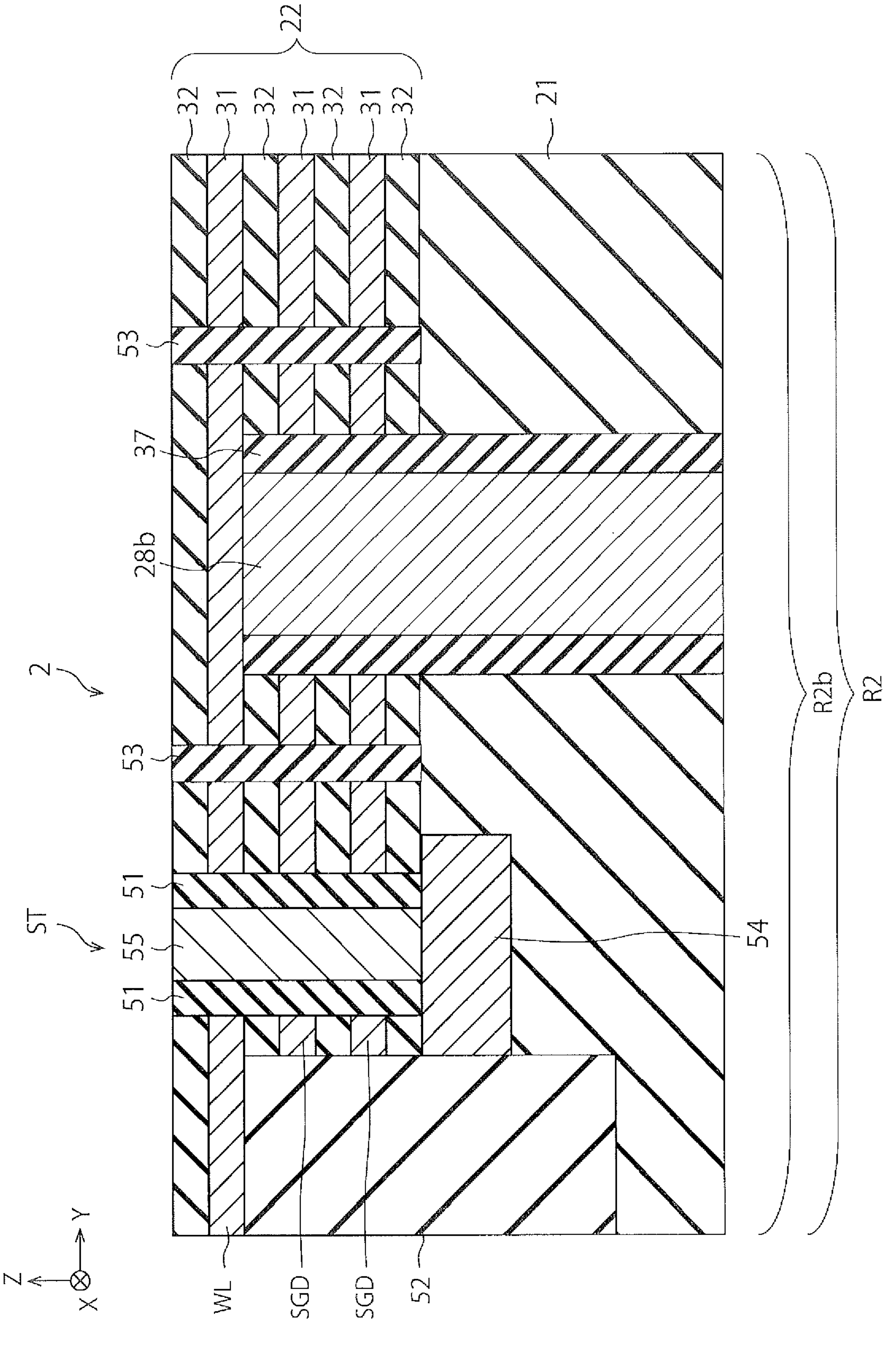
FIG. 12 is a cross-sectional view showing the structure of the semiconductor device according to the third modification of the first embodiment.

FIG. 12 is a cross-sectional view showing the structure of the semiconductor device according to the third modification of the first embodiment.

FIG. 12 shows a YZ cross section of the partial region R2*b* shown in FIG. 11. The semiconductor device according to the present modification includes, in addition to the elements shown in FIG. 11, a wiring layer 55 formed in the slit ST via the insulating films 51. The wiring layer 55 is, for example, a polysilicon layer or a metal layer. FIG. 12 further shows the plurality of beam portions 53 penetrating the stack of films 22 and the contact plug 28*b* provided in the stack of films 22 via the insulating film 37.

As shown in FIG. 12, each bridge portion 54 according to the present modification is disposed on lower surfaces of the insulating films 51 and the wiring layer 55. Each bridge portion 54 according to the present modification is provided in order to limit deformation of the drain-side select lines SGD and the portion $P_{SG}$. In the present modification, the wiring layer 55 includes a W (tungsten) layer, and each bridge portion 54 includes a material other than that of the W layer. Each bridge portion 54 includes, for example, an insulating metal compound film such as a metal oxide film.

FIG. 12 further shows the insulating film 52 in contact with the bridge portion 54. The insulating film 52 may be further in contact with the insulating films 51.

As described above, the plurality of insulating films 52 according to the present embodiment extend between the insulating films 51, and end in the partial region R2*b* by coming into contact with any one of the insulating films 51. Therefore, according to the present embodiment, the insulating films 52 can be suitably disposed. For example, the electrode layers 31 in the partial region R2*b* can be divided into the plurality of portions $P_{SG}$ each having a suitable shape by the insulating films 52, and as a result, the contact plugs 28*b* are easily disposed in the portions $P_{SG}$.

Second Embodiment

Figure 13:
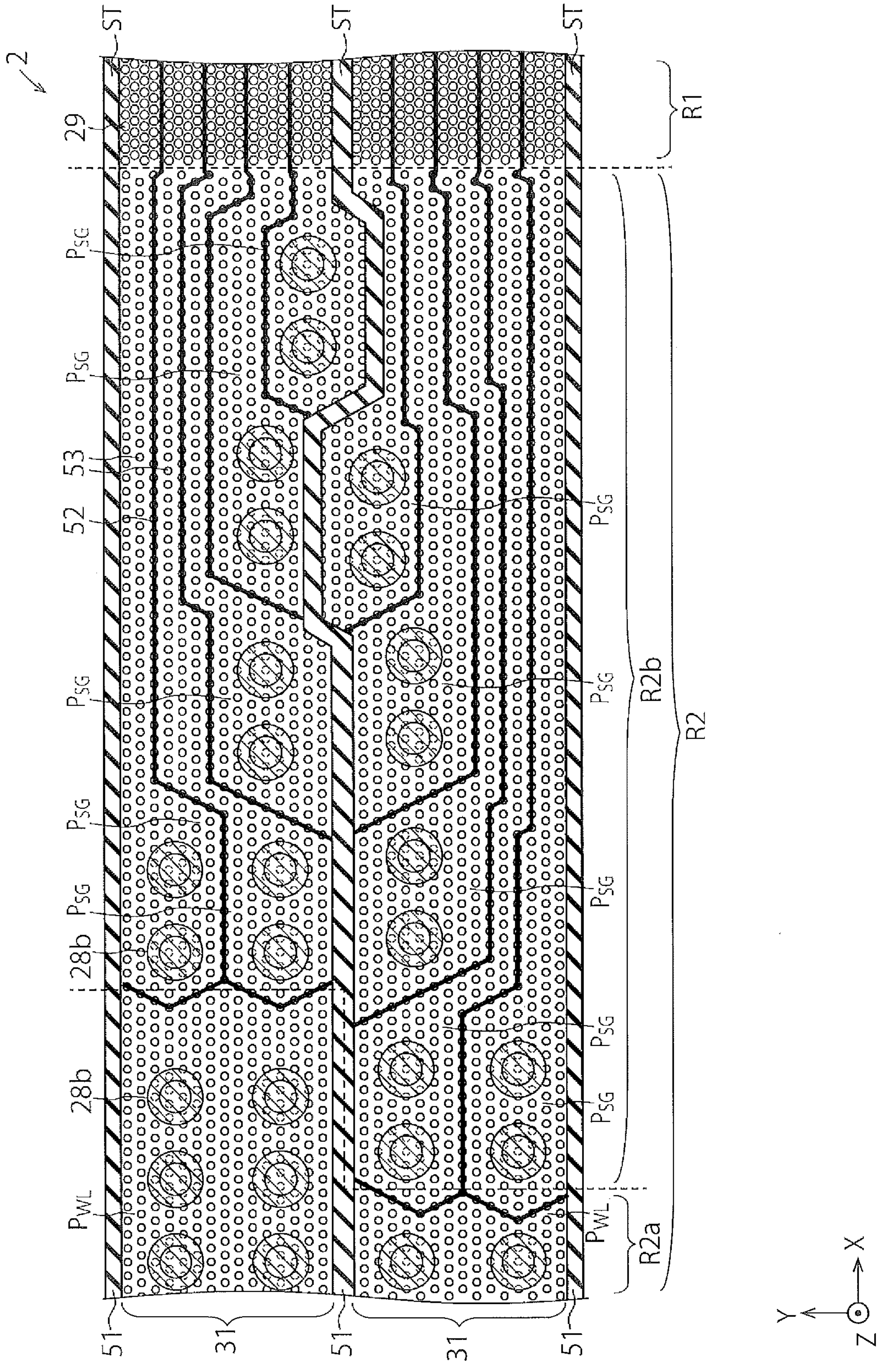
FIG. 13 is a plan view showing a structure of a semiconductor device according to a second embodiment.

FIG. 13 is a plan view showing a structure of a semiconductor device according to a second embodiment.

Similar to FIG. 8, FIG. 13 shows the plurality of slits ST, the plurality of insulating films 51, the plurality of insulating films 52, the plurality of beam portions 53, and the like in the stack of films 22. Similar to the first embodiment, each insulating film 52 according to the present embodiment is in contact with at least one insulating film 51, and each portion $P_{SG}$ is electrically connected to one or more (here, two) contact plugs 28*b*. The beam portions 53 on the contact plugs 28*b* are indicated by a dashed line.

FIG. 13 shows three insulating films 51. Among the insulating films 51, the insulating film 51 positioned closest to a +Y direction side is called an "upper insulating film 51", and the insulating film 51 positioned closest to a −Y direction side is called a "lower insulating film 51", and the remaining insulating film 51 is called a "central insulating film 51". In FIG. 13, the central insulating film 51 includes a portion having an S shape in plan view in the partial region R2*b*.

Figure 14:
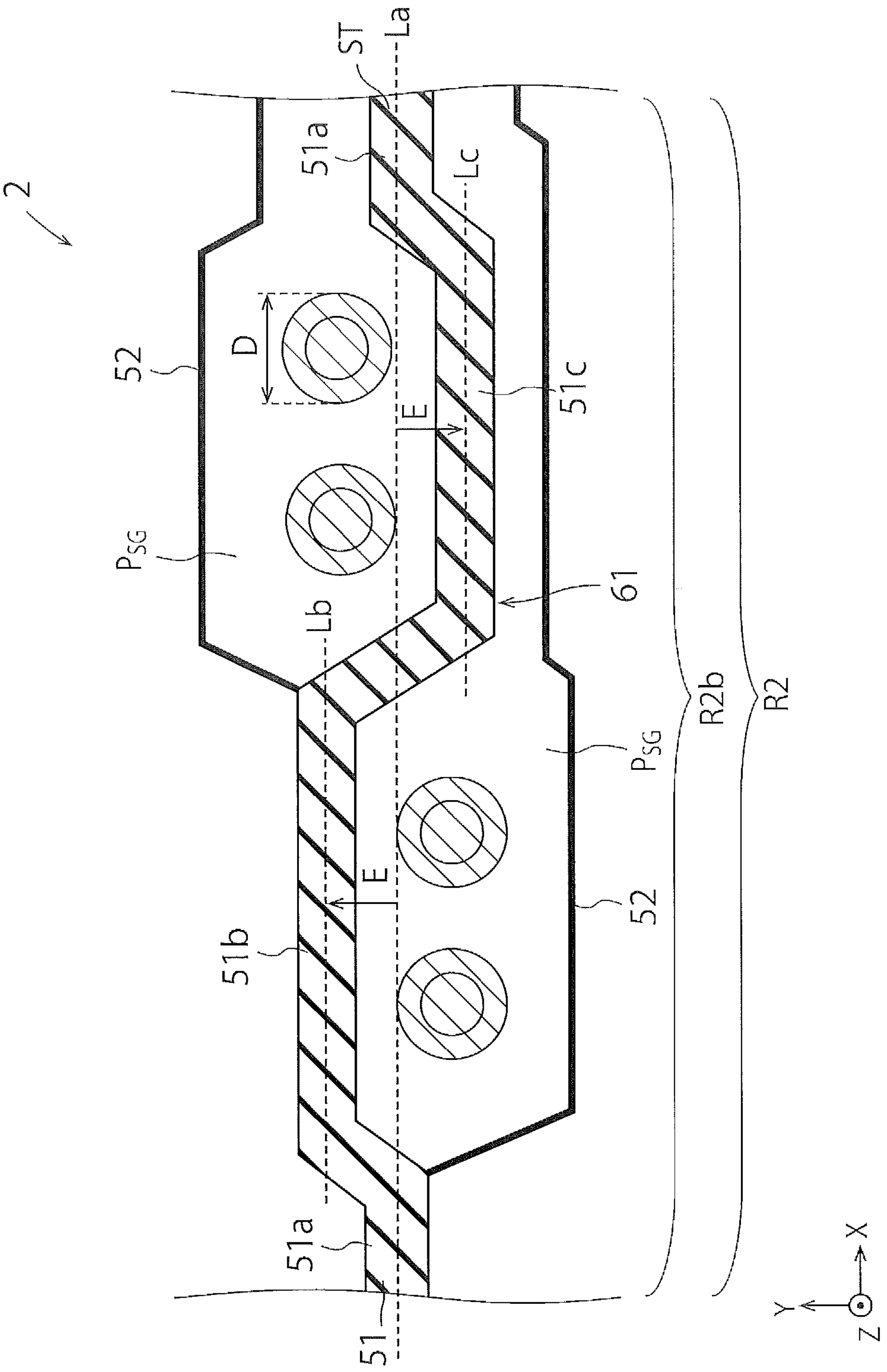
FIG. 14 is an enlarged plan view showing the structure of the semiconductor device according to the second embodiment.

FIG. 14 is an enlarged plan view showing the structure of the semiconductor device according to the second embodiment.

FIG. 14 shows the central insulating film 51. The central insulating film 51 includes two portions 51*a*, one portion 51*b*, and one portion 51*c* in the partial region R2*b*. The portions 51*a*, 51*b*, 51*c* are examples of the first, second, and third portions, respectively.

Each portion 51*a* extends in the X direction. The portion 51*b* is in contact with the left portion 51*a* and protrudes in the +Y direction with respect to each portion 51*a*. The portion 51*c* is in contact with the portion 51*b* and the right portion 51*a* and protrudes in the −Y direction with respect to each portion Sla. Accordingly, the portion 51*b* and the portion 51*c* form an S-shaped portion 61 having an S shape in plan view.

FIG. 14 further shows two portions $P_{SG}$ adjacent to the S-shaped portion 61, four contact plugs 28*b* electrically connected to the portions $P_{SG}$, and a diameter D of each contact plug 28*b*. The diameter D of each contact plug 28*b* is, for example, 750 nm to 800 nm. FIG. 14 further shows straight lines La, Lb, and Lc extending in the X direction. The straight line Lb is positioned in the +Y direction by a distance E from the straight line La, and the straight line Lc is positioned in the −Y direction by the distance E from the straight line La. The distance E is, for example, 400 nm or more.

In the present embodiment, a center line of each portion Sla is positioned on the straight line La. A center line of the portion 51*b* is positioned in the +Y direction from the straight line La, and a center line of the portion 51*c* is positioned in the −Y direction from the straight line La. In FIG. 14, most of the center line of the portion 51*b* is positioned on the straight line Lb, and most of the center line of the portion 51*c* is positioned on the straight line Lc. The distance E between the straight lines La and Lb may be different from the distance E between the straight lines La and Lc.

Here, a width between the "portions 51*a* of the central insulating film 51" and the "upper insulating film 51" in FIG. 13 is indicated by W. In this case, a width between the "portion 51*b* of the central insulating film 51" and the "upper insulating film 51" in FIG. 13 is approximately W−E, and a width between the "portion 51*c* of the central insulating film 51" and the "upper insulating film 51" in FIG. 13 is approximately W+E. As a result, the insulating films 51 each include a portion where a width between the insulating films 51 is W, a portion where a width between the insulating films 51 is W−E, and a portion where a width between the insulating films 51 is W+E. The same applies to a width between the "central insulating film 51" and the "lower insulating film 51" in FIG. 13 and further applies to any two insulating films 51 adjacent to each other in the Y direction. The widths W, W−E, and W+E are examples of the first, second, and third widths, respectively.

The S-shaped portion 61 in FIG. 14 is disposed in the vicinity of the array region R1 in FIG. 13. Therefore, a distance between the S-shaped portion 61 and the array region R1 is shorter than a distance between the S-shaped portion 61 and the partial region R2*a*. That is, a distance between a right end of the portion 51*c* and the array region R1 is shorter than a distance between a left end of the portion 51*b* and the partial region R2*a*.

A width of each portion $P_{SG}$ in the Y direction is difficult to set wide in the vicinity of the array region R1. A reason is that many insulating films 52 are disposed in the vicinity of the array region R1. Therefore, the S-shaped portion 61 according to the present embodiment is disposed in the vicinity of the array region R1. Accordingly, a width of each portion $P_{SG}$ in the Y direction can be set wide in the vicinity of the array region R1. As a result, the contact plug 28*b* having the large diameter D can also be arranged in the portion $P_{SG}$ in the vicinity of the array region R1. In the present embodiment, in order to facilitate the disposal of the contact plug 28*b* in the portion $P_{SG}$ in the vicinity of the array region R1, it is preferably to set the distance E to about half the diameter D (E≈D/2). When the contact plugs 28*b* have different diameters D, the distance E is preferably set to about half the diameter D of the contact plug 28*b* disposed in the portion $P_{SG}$ in the vicinity of the array region R1.

(1) First Modification

Figure 15:
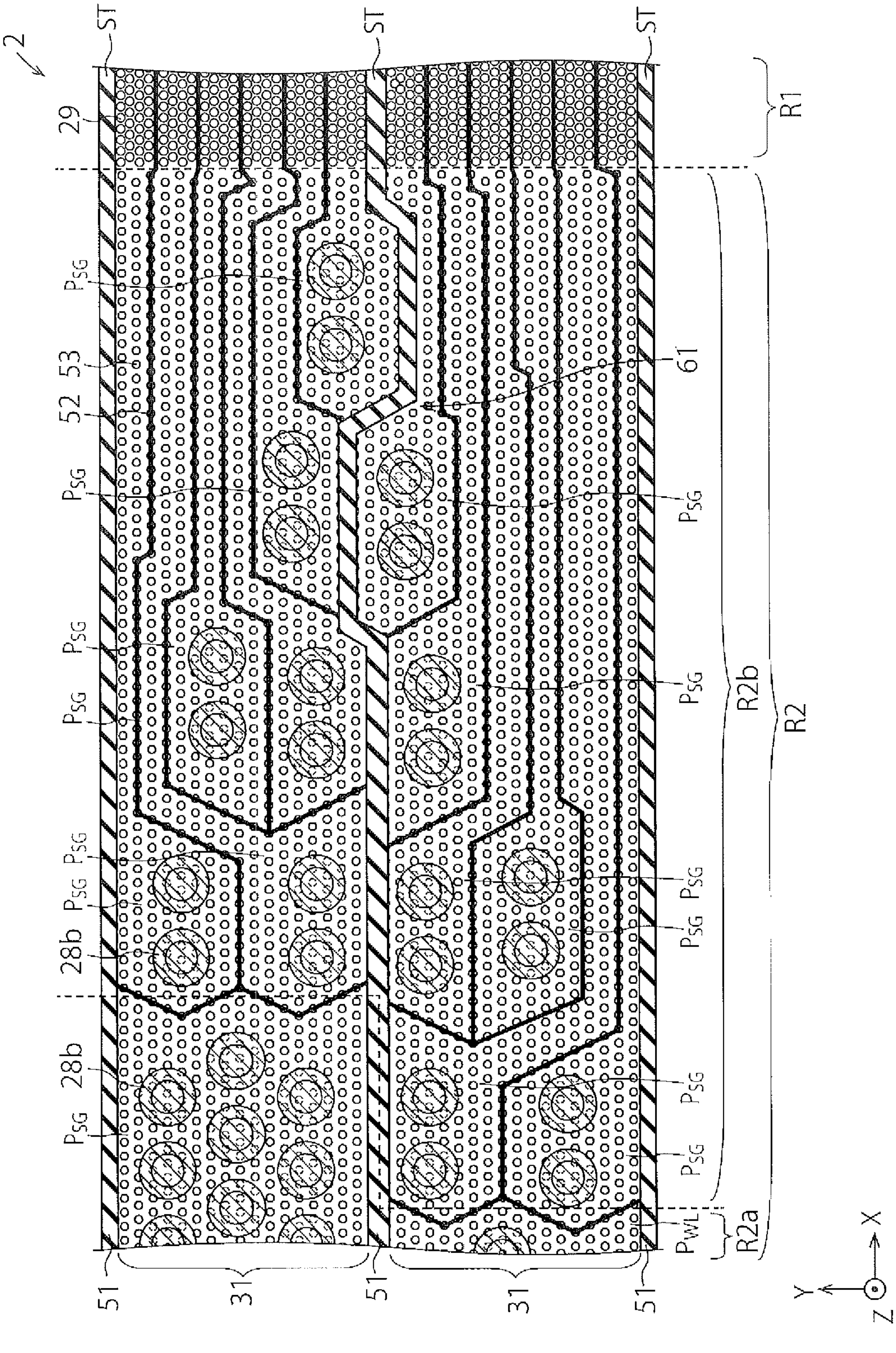
FIG. 15 is a plan view showing a structure of a semiconductor device according to a first modification of the second embodiment.

FIG. 15 is a plan view showing a structure of a semiconductor device according to a first modification of the second embodiment.

The semiconductor device (FIG. 15) according to the present modification has substantially the same structure as that of the semiconductor device (FIG. 13) according to the second embodiment. However, the array region R1 shown in FIG. 13 includes four insulating films 52 between two insulating films 51 adjacent in the Y direction, whereas the array region R1 shown in FIG. 15 includes five insulating films 52 between two insulating films 51 adjacent in the Y direction. As a result, the partial region R2*b* shown in FIG. 13 includes five portions $P_{SG}$ between two insulating films 51 adjacent in the Y direction, whereas the partial region R2*b* shown in FIG. 15 includes six portions $P_{SG}$ between two insulating films 51 adjacent in the Y direction. Accordingly, the number of the portions $P_{SG}$ in the partial region R2*b* may be any number.

(2) Second Modification

Figure 16:
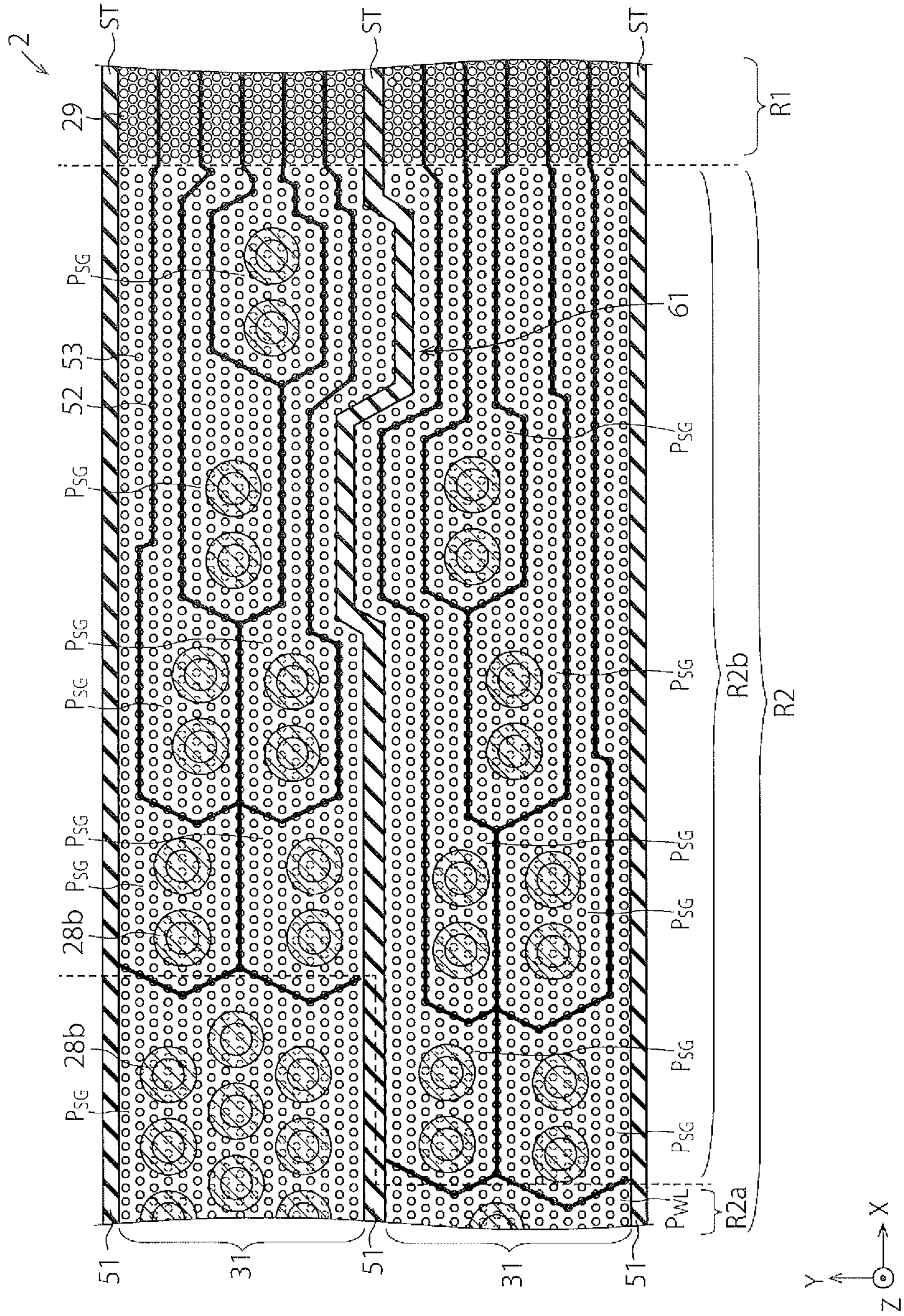
FIG. 16 is a plan view showing a structure of a semiconductor device according to a second modification of the second embodiment.

FIG. 16 is a plan view showing a structure of a semiconductor device according to a second modification of the second embodiment.

The semiconductor device (FIG. 16) according to the present modification has substantially the same structure as that of the semiconductor device (FIG. 15) according to the first modification. However, shapes of the plurality of insulating films 52 shown in FIG. 16 are different from shapes of the plurality of insulating films 52 shown in FIG. 15. As a result, shapes of the plurality of portion $P_{SG}$ shown in FIG. 16 are different from shapes of the plurality of portion $P_{SG}$ shown in FIG. 15. Accordingly, the shape of each portion $P_{SG}$ may be any shape.

(3) Third Modification

Figure 17:
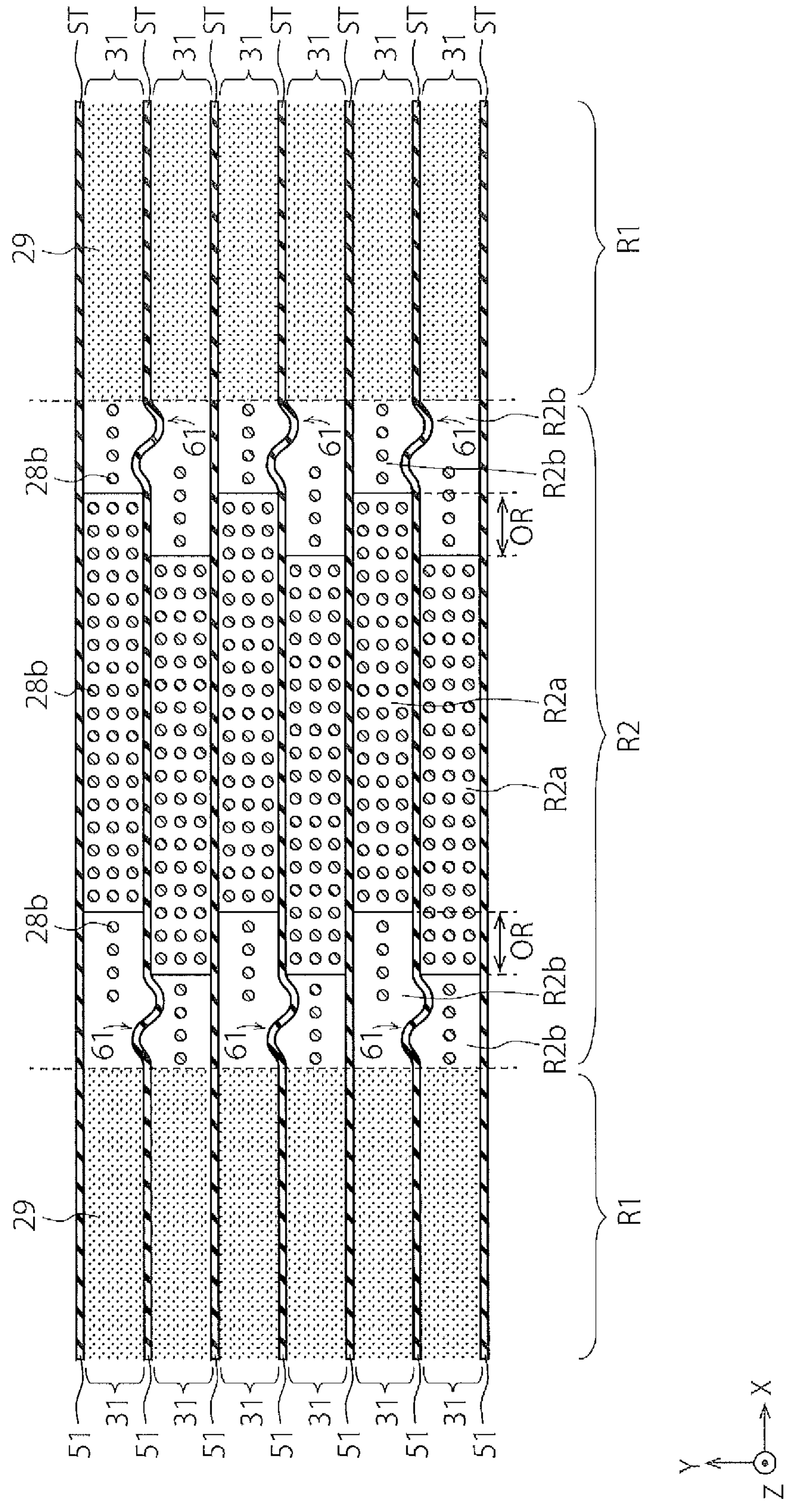
FIG. 17 is a plan view showing a structure of a semiconductor device according to a third modification of the second embodiment.

FIG. 17 is a plan view showing a structure of a semiconductor device according to a third modification of the second embodiment.

FIG. 17 shows seven insulating films 51 and six S-shaped portions 61 included in the insulating films 51. The insulating films 52 and the beam portions 53 are not shown in FIG. 17. In FIG. 17, there are three insulating films 51 each including two S-shaped portions 61, and there are four insulating films 51 not including the S-shaped portion 61. The former three insulating films 51 and the latter four insulating films 51 are alternately disposed in the Y direction. That is, the semiconductor device according to the present modification alternately includes, in the Y direction, the plurality of insulating films 51 each including the S-shaped portion 61, and the plurality of insulating films 51 not including the S-shaped portions 61. Accordingly, any two insulating films 51 adjacent to each other in the Y direction each include a portion where a width between the insulating films 51 is W, a portion where a width between the insulating films 51 is W−E, and a portion where the width between the insulating films 51 is W+E.

In FIG. 17, a region between any two insulating films 51 adjacent to each other in the Y direction includes one partial region R2*a* and two partial regions R2*b* between two array regions R1. A symbol OR indicates an overlap region in which the partial region R2*a* and the partial regions R2*b* overlap in the Y direction. FIG. 17 shows two left overlap regions OR including a left overlap region OR and a right overlap region OR.

Here, the region between any two insulating films 51 adjacent to each other in the Y direction is called an inter-slit region. FIG. 17 shows six inter-slit regions. A certain inter-slit region includes a partial region R2*a* in the left overlap region OR. Another inter-slit region includes a partial region R2*b* in the left overlap region OR. The latter partial region R2*b* is positioned in the +Y direction or −Y direction from the former partial region R2*a*. Such a relation also holds for the right overlap region OR.

According to the present modification, it is possible to freely set the shape of the portions $P_{SG}$ by providing the overlap region OR. As shown in FIG. 13, a length of the partial region R2*b* in the X direction required in each inter-slit region varies depending on the shape of the portions $P_{SG}$. Therefore, the length of the partial region R2*b* in the X direction is preferably different for each partial region R2*b*. According to the present modification, it is possible to allow the overlap region OR to absorb a difference in length in the X direction between the partial regions R2*b* by providing the overlap region OR. Accordingly, it is possible to improve an area efficiency of the semiconductor device according to the present modification.

(4) Fourth Modification

Figure 18:
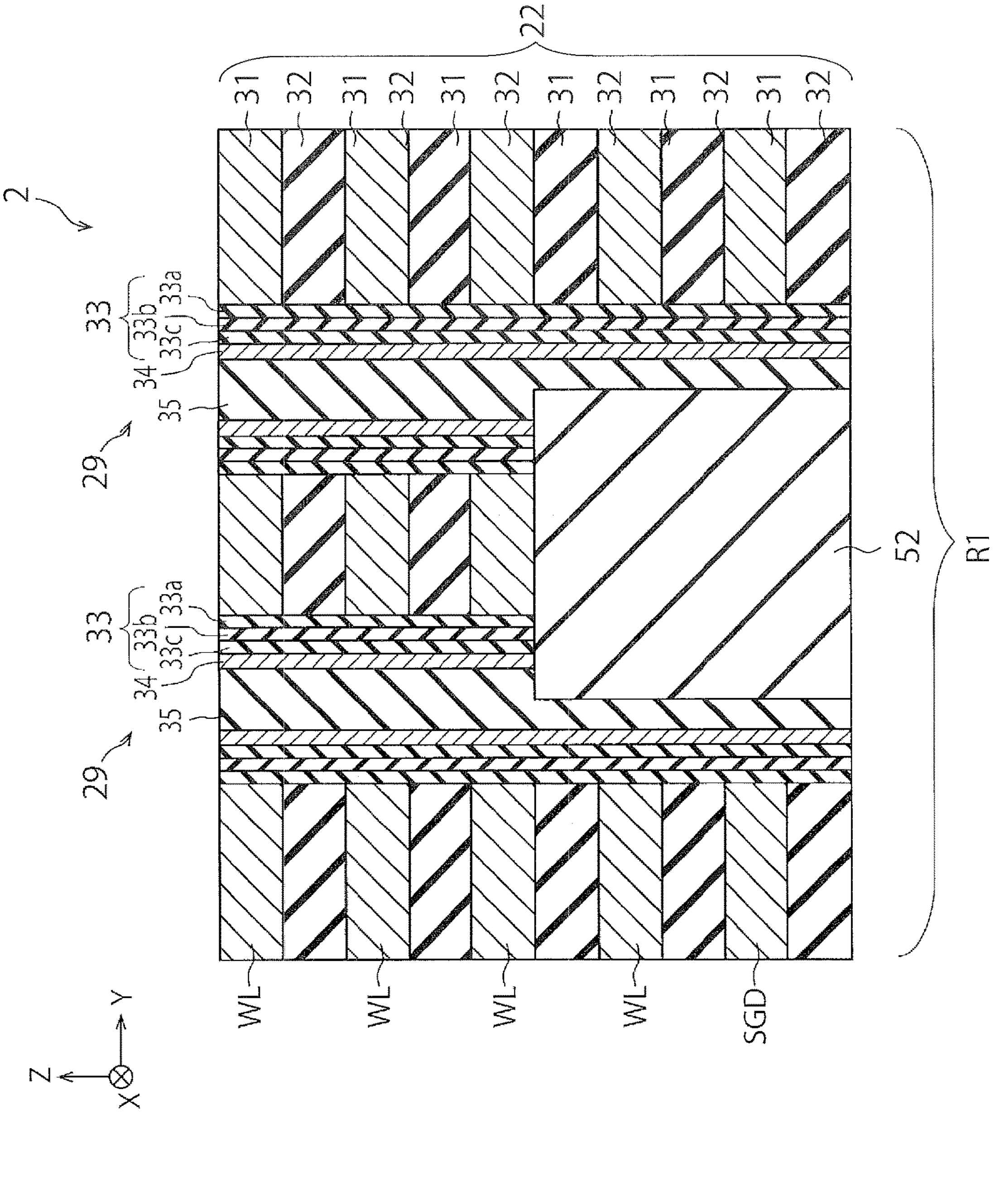
FIG. 18 is a cross-sectional view showing a structure of a semiconductor device according to a fourth modification of the second embodiment.

FIG. 18 is a cross-sectional view showing a structure of a semiconductor device according to a fourth modification of the second embodiment.

FIG. 18 shows a YZ cross section of the array region R1 shown in FIG. 13. FIG. 18 shows one insulating film 52 formed below two columnar portions 29. Each columnar portion 29 shown in FIG. 18 includes an upper portion positioned above an upper surface of the insulating film 52 and a lower portion positioned below the upper surface of the insulating film 52. The upper portion according to the present modification has a circular shape in plan view. On the other hand, the lower portion according to the present modification has a semicircular shape in plan view due to an influence of the insulating film 52. The lower portion faces a side surface of the insulating film 52. The five electrode layers 31 shown in FIG. 18 are word lines, for example.

The memory insulating film 33, the channel semiconductor layer 34, and the core insulating film 35 in each columnar portion 29 according to the present modification form a memory cell not only in the upper portion but also in the lower portion. That is, in the present modification, the lower portion whose shape is changed from circular to semicircular due to the influence of the insulating film 52 is also used as a memory cell. Accordingly, it is possible to increase the number of the memory cells in the semiconductor device according to the present modification.

As described above, the plurality of insulating films 52 according to the present embodiment extend between the insulating films 51, and end in the partial region R2*b* by coming into contact with any one of the insulating films 51. Therefore, according to the present embodiment, the insulating films 52 can be suitably disposed. For example, the electrode layers 31 in the partial region R2*b* can be divided into the plurality of portions $P_{SG}$ each having a suitable shape by the insulating films 52, and as a result, the contact plugs 28*b* are easily disposed in the portions $P_{SG}$.

Further, the plurality of insulating films 51 according to the present embodiment includes the insulating films 51 each including the S-shaped portion 61. Accordingly, it is possible to make it easier to dispose the contact plug 28*b* in each portion $P_{SG}$.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:

a substrate;

a stack of films disposed above the substrate and including a plurality of electrode layers separated from each other in a first direction;

an array region disposed on the substrate and including a memory cell array, the memory cell array having a plurality of word lines and a plurality of select lines that constitute the plurality of electrode layers;

a first plug region disposed on the substrate, located in a second direction from the array region, and including a first contact plug electrically connected to a first select line of the plurality of select lines; and a second plug region disposed on the substrate, located in the second direction from the first plug region, and including a second contact plug electrically connected to a first word line of the plurality of word lines, wherein the first plug region further includes:

a plurality of first insulating films disposed in the stack of films and extending in the second direction; and a plurality of second insulating films disposed in the stack of films and each second insulating film having a portion extending between corresponding two of the first insulating films.

2. The semiconductor device according to claim 1, further comprising:

a third plug region disposed on the substrate, the third plug region located in the second direction from the second plug region, and including a third contact plug electrically connected to a second select line different from the first select line.

3. The semiconductor device according to claim 1, wherein the plurality of word lines extend in the second direction.

4. The semiconductor device according to claim 1, wherein each of the plurality of second insulating films is in contact with a metal layer.

5. The semiconductor device according to claim 1, wherein at least one first insulating film of the plurality of first insulating films includes:

a first portion extending in the second direction;

a second portion in contact with the first portion and protruding in a third direction with respect to the first portion; and a third portion in contact with the second portion and protruding toward an opposite side in the third direction with respect to the first portion.

6. The semiconductor device according to claim 5, wherein the second and third portions each have an S shape.

7. The semiconductor device according to claim 5, wherein the second and third portions are disposed in the first plug region, and a distance between the second and third portions and the array region is shorter than a distance between the second and third portions and the second plug region.

8. The semiconductor device according to claim 1, wherein among the plurality of first insulating films, two first insulating films adjacent to each other in a third direction each include:

a portion where a width between the two insulating films has a first value;

a portion where the width between the two insulating films has a second value smaller than the first value; and a portion where the width between the two insulating films has a third value larger than the first value.

9. The semiconductor device according to claim 8, wherein the second plug region disposed in a region between the two first insulating films is disposed in the third direction of the first plug region disposed outside the region between the two first insulating films.

10. The semiconductor device according to claim 1, wherein at least one second insulating film of the plurality of second insulating films is disposed below a columnar portion, the columnar portion including a charge storage layer and a semiconductor layer in the array region, and a portion of the charge storage layer and the semiconductor layer in the columnar portion facing a side surface of the at least one second insulating film constitutes a memory cell.

11. A semiconductor device, comprising:

a substrate;

a stack of films disposed above the substrate and including a plurality of electrode layers separated from each other in a first direction;

a first array region disposed on the substrate and including a first memory cell array having a first word line that constitutes one of the plurality of electrode layers;

a plug region disposed on the substrate, located in a second direction from the first array region, and including a plurality of contact plugs; and a second array region disposed on the substrate, located in the second direction from the plug region, and including a second memory cell array having a second word line that constitutes another one of the plurality of electrode layers, wherein the contact plugs include a first plug electrically connected to the first word line and a second plug electrically connected to the second word line, wherein the plug region further includes: a plurality of first insulating films disposed in the stack of films and extending in the second direction; and a plurality of second insulating films disposed in the stack of films and each second insulating film having a portion extending between corresponding two of the first insulating films.

12. The semiconductor device according to claim 11, wherein the plug region includes:

a first region located in the second direction from the first array region and including the first plug; and a second region located in the second direction from the first plug region and including the second plug.

13. The semiconductor device according to claim 11, wherein the first word line and the second word line extend in the second direction.

14. The semiconductor device according to claim 11, wherein each of the plurality of second insulating films is in contact with a metal layer.

15. The semiconductor device according to claim 11, wherein the plurality of electrode layers include a first electrode layer including the first word line and a second electrode layer including the second word line, and the first plug penetrates an electrode layer disposed between the substrate and the first electrode layer, and the second plug penetrates an electrode layer disposed between the substrate and the second electrode layer.

* * * * *